United States Patent
Horio et al.

(10) Patent No.: US 8,530,272 B2
(45) Date of Patent: Sep. 10, 2013

(54) METHOD FOR GROWING ZINC-OXIDE-BASED SEMICONDUCTOR DEVICE AND METHOD FOR MANUFACTURING SEMICONDUCTOR LIGHT EMITTING DEVICE

(75) Inventors: Naochika Horio, Tokyo (JP); Masayuki Makishima, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 459 days.

(21) Appl. No.: 12/784,704

(22) Filed: May 21, 2010

(65) Prior Publication Data

US 2010/0295039 A1  Nov. 25, 2010

(30) Foreign Application Priority Data

May 25, 2009  (JP) .................. 2009-125494

(51) Int. Cl.
H01L 21/84  (2006.01)
(52) U.S. Cl.
USPC ............ 438/104; 257/43; 257/E33.019
(58) Field of Classification Search
USPC ............ 257/43, E33.019; 438/104
See application file for complete search history.

(56) References Cited

U.S. PATENT DOCUMENTS

| | | | |
|---|---|---|---|
| 6,624,441 B2 | 9/2003 | Cantwell et al. | |
| 6,673,478 B2* | 1/2004 | Kato et al. | 428/698 |
| 7,964,868 B2 | 6/2011 | Nakagawa et al. | |
| 2006/0170013 A1 | 8/2006 | Kato et al. | |
| 2009/0044745 A1* | 2/2009 | Sekiwa et al. | 117/36 |
| 2009/0087940 A1* | 4/2009 | Kushiya | 438/94 |
| 2009/0256148 A1* | 10/2009 | Park et al. | 257/43 |
| 2009/0267062 A1 | 10/2009 | Nakahara et al. | |
| 2009/0267063 A1 | 10/2009 | Nakagawa et al. | |
| 2010/0230671 A1 | 9/2010 | Nakahara et al. | |
| 2010/0295040 A1 | 11/2010 | Horio et al. | |

FOREIGN PATENT DOCUMENTS

| | | |
|---|---|---|
| JP | 2004-296821 A | 10/2004 |
| JP | 2004296821 | * 10/2004 |
| JP | 2005-302940 A | 10/2005 |
| JP | 2006-73726 A | 3/2006 |
| JP | 2007-073672 A | 3/2007 |
| JP | 2009-078959 A | 4/2009 |

OTHER PUBLICATIONS

Kato et la (Journal of crystal growth 265(2004) 375-381.*
M.W.Cho et al (Superlattices and Microstructures 38 (2005) 349-363).*
Sunri et al (Japanese applied journal of applied physics, vol. 24, No. 12, Dec. 1985, pp. 1607-1610).*
Kato et al (Journal of Crystal growth 265(2004)375-381).*
M.W.Cho et al (supperlattices and Microstructures 38 (2005)349-363).*

(Continued)

Primary Examiner — Matthew W Such
Assistant Examiner — Ali Naraghi
(74) Attorney, Agent, or Firm — Holtz, Holtz, Goodman & Chick, PC

(57) ABSTRACT

A method which has a step of growing a thermostable-state ZnO-based single crystal on a ZnO single crystal substrate at a growth temperature that is equal to or greater than 600° C. and less than 900° C. by using a metalorganic compound containing no oxygen and water vapor based on an MOCVD method.

9 Claims, 20 Drawing Sheets

(56) References Cited

OTHER PUBLICATIONS

Sunri et al (Japanese applied Journal of applied physics, vol. 24, No. 12, Dec. 1985, pp. 1607-1610).*

Japanese Office Action dated Jan. 29, 2013 (and English translation thereof) in counterpart Japanese Application No. 2009-125494.

U.S. Appl. No. 12/784,732, filed May 21, 2010, Inventors: Naochika Horio, et al; entitled: Method for Growing Zinc-Oxide-Based Semiconductor Device and . . . .

* cited by examiner

FIG.11

| | GROWTH CONDITIONS | | | | PHYSICAL PROPERTIES OF GROWTH LAYER | | | | |
|---|---|---|---|---|---|---|---|---|---|
| | ZnO SUBSTRATE | CARRIER GAS RESIDUAL O2 | OXYGEN SOURCE | BUFFER LAYER (ANNEAL) | GROWTH LAYER | FLATNESS SEM/AFM RMS | CRYSTAL ORIENTATION (100) ω FWHM | INTERFACIAL IMPURITY STORAGE (SIMS) | IMPURITY DIFFUSION (SIMS) |
| FIRST EMBODIMENT | <40 arcsec ETCHING | ≦5ppm | H2O | — | ZnO <EMB1> | 0.18 nm | 35.9 arcsec | ABSENT | PRESENT |
| SECOND EMBODIMENT | <40 arcsec ETCHING | <0.1ppm | H2O | — | ZnO <EMB2> | 0.31 nm | 33.0 arcsec | ABSENT | SUP-PRESSED |
| THIRD EMBODIMENT | <40 arcsec ETCHING | <1ppb | H2O | — | MgxZn1-xO on ZnO <EMB3> | 0.56 nm | 29.0 arcsec | ABSENT | SUP-PRESSED |
| COMPARA-TIVE EXAMPLE-1 | <40 arcsec ETCHING | <1ppb | H2O | LT-ZnO +ANNEAL | ZnO <CMP1> | 0.12 nm | 30.2 arcsec | PILEUP | PRESENT |
| COMPARA-TIVE EXAMPLE-2 | <40 arcsec ETCHING | <1ppb | O2 | — | ZnO <CMP2> | COLUMNAR POLY-CRYSTAL | — | — | — |
| COMPARA-TIVE EXAMPLE-3 | <40 arcsec ETCHING | <1ppb | N2O | — | ZnO <CMP3> | PLATE-LIKE, WALL-LIKE POLY-CRYSTAL | — | — | — |

FIG.29

UPPER COLUMN: MORPHOLOGY
LOWER COLUMN: FWHM of (100)ω

| Pg \ Tg | 550°C | 600°C | 700°C | 800°C | 900°C |
|---|---|---|---|---|---|
| 10kPa | WALL-LIKE (THIN WALL) <40 arcsec | FLAT 32 arcsec | FLAT 35 arcsec | GROWTH LIMIT | GROWTH LIMIT |
| 20kPa | WALL-LIKE (THIN WALL) <40 arcsec | FLAT 32 arcsec | FLAT 35 arcsec | FLAT 16 arcsec | GROWTH LIMIT |
| 40kPa | WALL-LIKE (THIN WALL) <40 arcsec | FLAT 27 arcsec | FLAT 35 arcsec | FLAT 25 arcsec | GROWTH LIMIT |
| 80kPa | WALL-LIKE (THIN WALL) <40 arcsec | FLAT 27 arcsec | FLAT 28 arcsec | FLAT 26 arcsec | GROWTH LIMIT |

METHOD FOR GROWING ZINC-OXIDE-BASED SEMICONDUCTOR DEVICE AND METHOD FOR MANUFACTURING SEMICONDUCTOR LIGHT EMITTING DEVICE

BACKGROUND OF THE INVENTION

1. Technical Field

The present invention relates to a method for growing a zinc-oxide-based semiconductor device and a method for manufacturing a semiconductor device, and more particularly to a method for growing a zinc-oxide-based semiconductor layer on a ZnO substrate and a method for manufacturing a zinc-oxide-based semiconductor light emitting device based on an MOCVD method.

2. Description of the Related Art

A zinc oxide (ZnO) is a direct transition type semiconductor having band gap energy of 3.37 eV at a room temperature, and it is expected as a material for a photoelectronic device in a blue or ultraviolet region. In particular, it has physical properties very suitable for a semiconductor light emitting device, i.e., an exciton binding energy of 60 meV and a refractive index n=2.0. Further, the zinc oxide can be employed for a wide range of devices including surface-acoustic wave (SAW) devices, piezoelectric devices, and the like. Moreover, ZnO as a raw material has the advantages that it is inexpensive and is not harmful to the environment and human bodies.

In general, as a crystal growth method for a zinc-oxide-based compound semiconductor device, an MOCVD (Metal Organic Chemical Vapor Deposition) method, an MBE (Molecular Beam Epitaxy) method, or a PLD (Pulsed Laser Deposition) method is utilized. The MBE method is a crystal growth method in an ultrahigh vacuum, and it has problems that an apparatus is expensive and productivity is low. On the other hand, the MOCVD method has advantages that an apparatus is relatively inexpensive, large-area growth and/or simultaneous multiple-wafer growth is possible, a throughput is high, and the method is excellent in mass productivity or a cost.

Meanwhile, in a conventional single-crystal growth technology for a group-III-V-based compound semiconductor, single-crystal growth can be readily performed on a substrate of the same type of single-crystal. However, utilizing the MOCVD method to directly grow a zinc-oxide-based single crystal (which will be also referred to as a ZnO-based single crystal hereinafter) on a ZnO single crystal substrate was difficult More specifically, even if the MOCVD method is utilized to grow a ZnO-based single crystal layer on a ZnO single crystal substrate at a high temperature of, e.g., approximately more than 500° C., a crystal layer having granular, whisker-like, rod-like or disc-like crystals or aggregation thereof is apt to be produced. Moreover, even if a single crystal is grown, the crystal layer is formed to have many regions where crystal axes thereof are slightly deviated from each other. As described above, there was a problem that a high-quality ZnO-based single crystal layer having excellent flatness and crystal orientation could not be grown on a ZnO substrate at a high temperature.

On the other hand, a manufacture problem of a ZnO substrate used for crystal growth is pointed out. For example, impurities contained in an ingot (i.e., a bulk single crystal) manufactured by, for example, a hydrothermal method and present on a substrate surface generate defects or dislocations in an epitaxial growth layer, or a mechanical damage introduced in a substrate slicing process and remaining on the substrate surface generates a defect or dislocation in the epitaxial growth layer (e.g., a Japanese Patent Publication No. 4045499 (which will be referred to as Patent Document 1 hereinafter).

To avoid such problems, a method for performing crystal growth by using a buffer layer is carried out (e.g., the Patent Document 1 and a Japanese Patent Application Laid-open No. 2006-73726 (which will be also referred to as Patent Document 2 hereinafter)). More specifically, in the MOCVD method, there is adopted a so-called buffer layer technology. In this technology, a ZnO crystal is grown on a ZnO single crystal substrate at a growth temperature lower than a temperature for growing a ZnO single crystal, e.g., a low temperature less than 500° C. to form a flat and dense amorphous or particulate polycrystal and a heat treatment is performed at a high temperature of approximately 500° C. or above to restore crystallinity or crystalline quality.

However, when growing a ZnO-based crystal on a buffer layer at a high temperature of approximately 500° C. or above, a crystal layer having poor flatness and crystal orientation is formed. Therefore, a single-crystal layer forming technology and the like applying the buffer layer technology have been developed (e.g., Patent Document 2).

Moreover, development of a method for growing a crystal close to an ideal crystal that has less crystal defects and has excellent flatness and crystal orientation is very important to achieve high performance and high reliability of a semiconductor device using a ZnO-based crystal. In particular, to manufacture a semiconductor light emitting device using the ZnO-based crystal, an n-type ZnO-based crystal layer that enables efficient injection of electrons into a light-emission layer, the light-emission layer having a high light-emission efficiency, a p-type ZnO-based crystal layer that enables efficient injection of holes into the light-emission layer are required. To obtain the respective layers of the semiconductor light emitting device, a crystal growth technology that can achieve a ZnO-based crystal having excellent flatness and crystal orientation and a low density of defects (i.e., Zn deficiency, oxygen deficiency, complex defects) or dislocation (screw dislocation, edge dislocation) must be established.

SUMMARY OF THE INVENTION

Although it can be considered that a ZnO single-crystal substrate has reached a high quality as a semiconductor device manufacturing substrate through advancement of the substrate manufacturing technology, the applicant recognized that the following problems are present in growth of a ZnO-based semiconductor crystal using the MOCVD method even though such a high-quality ZnO substrate is used and the present invention is directed to solve the problems. Specifically, the applicant appreciated that Li (lithium), Si (silicon) or Al (aluminum) as an impurity derived from the ZnO substrate (or substrate-derived impurity) is accumulated or stored in an interface region between the ZnO substrate and a crystal growth layer and such impurities derived from the substrate diffuse into a ZnO-based crystal growth layer in a conventional manufacturing method in which a buffer layer is grown on a ZnO single crystal substrate. The present invention is directed to solve such problems.

It is one object of the present invention to provide a method for growing on a ZnO single crystal substrate a ZnO-based single crystal which has excellent flatness and crystal orientation and a low defect/dislocation density and in which interfacial accumulation (or pileup) of impurities or diffusion of the impurities into a ZnO-based crystal growth layer is suppressed. Additionally, it is another object of the present invention to provide a semiconductor device having high performance and high reliability, especially a high-performance semiconductor light emitting device that is superior in a light-emission efficiency and a device life. Further, it is still another object of the present invention to provide a semiconductor light emitting device having a high production yield and excellent mass productivity.

According to one aspect of the present invention, there is provided a method for growing a ZnO-based crystal layer on a substrate of a zinc oxide (ZnO) single crystal by an MOCVD method, wherein a polar oxygen material and a metalorganic compound containing no oxygen are used; and the method includes a single-crystal growing step of growing a ZnO-based single crystal on the substrate at a growth temperature that is equal to or greater than 600° C. and less than 900° C.

Furthermore, according to another aspect of the present invention, there is provided a semiconductor device manufactured by forming ZnO-based semiconductor layers on a substrate of a ZnO single crystal by an MOCVD method, which includes:

a ZnO-based single crystal layer grown directly on the substrate at a growth temperature that is equal to or greater than 600° C. and less than 900° C. using a polar oxygen material and a metalorganic compound containing no oxygen; and a device layer grown on the ZnO-based single crystal layer, the device layer including at least one of an n-type ZnO-based semiconductor layer and a p-type ZnO-based semiconductor layer.

Additionally, according to a further aspect of the present invention, there is provided a ZnO-based single-crystal-layer-formed substrate, which includes:

a ZnO-based single crystal substrate containing at least one of Al, Li and Si as an impurity at a predetermined concentration; and a ZnO-based single crystal layer grown directly on the ZnO-based single crystal substrate, wherein accumulation of the impurity is not observed in an interface between the ZnO-based single crystal substrate and the ZnO-based single crystal layer when measurement is performed based on SIMS (secondary ion mass spectroscopy), and a concentration of the impurity in the ZnO-based single crystal layer is lower than the predetermined concentration when measurement is performed based on the SIMS.

BRIEF DESCRIPTION OF THE DRAWINGS

FIG. 11 is a list of growth conditions, evaluation results and physical properties of respective crystal growth layers according to the first to third embodiments of the invention and Comparative Examples-1 to 3;

FIG. 29 is a view showing a relationship between a growth condition range and flatness/crystal orientation of the growth layer;

DETAILED DESCRIPTION OF THE INVENTION

A method for growing a zinc-oxide (ZnO)-based semiconductor crystal layer having excellent single-crystallinity and flatness on a ZnO single crystal substrate based on the MOCVD method will now be described hereinafter in detail with reference to the accompanying drawings. Further, comparative examples for describing characteristics, configurations and effects of a growth method and a growth layer according to the embodiments will also be described in detail. Furthermore, as a semiconductor device formed based on the growth method according to the present invention, a semiconductor light emitting diode (LED) will be taken as an example to be described.

First Embodiment

Figure 1:
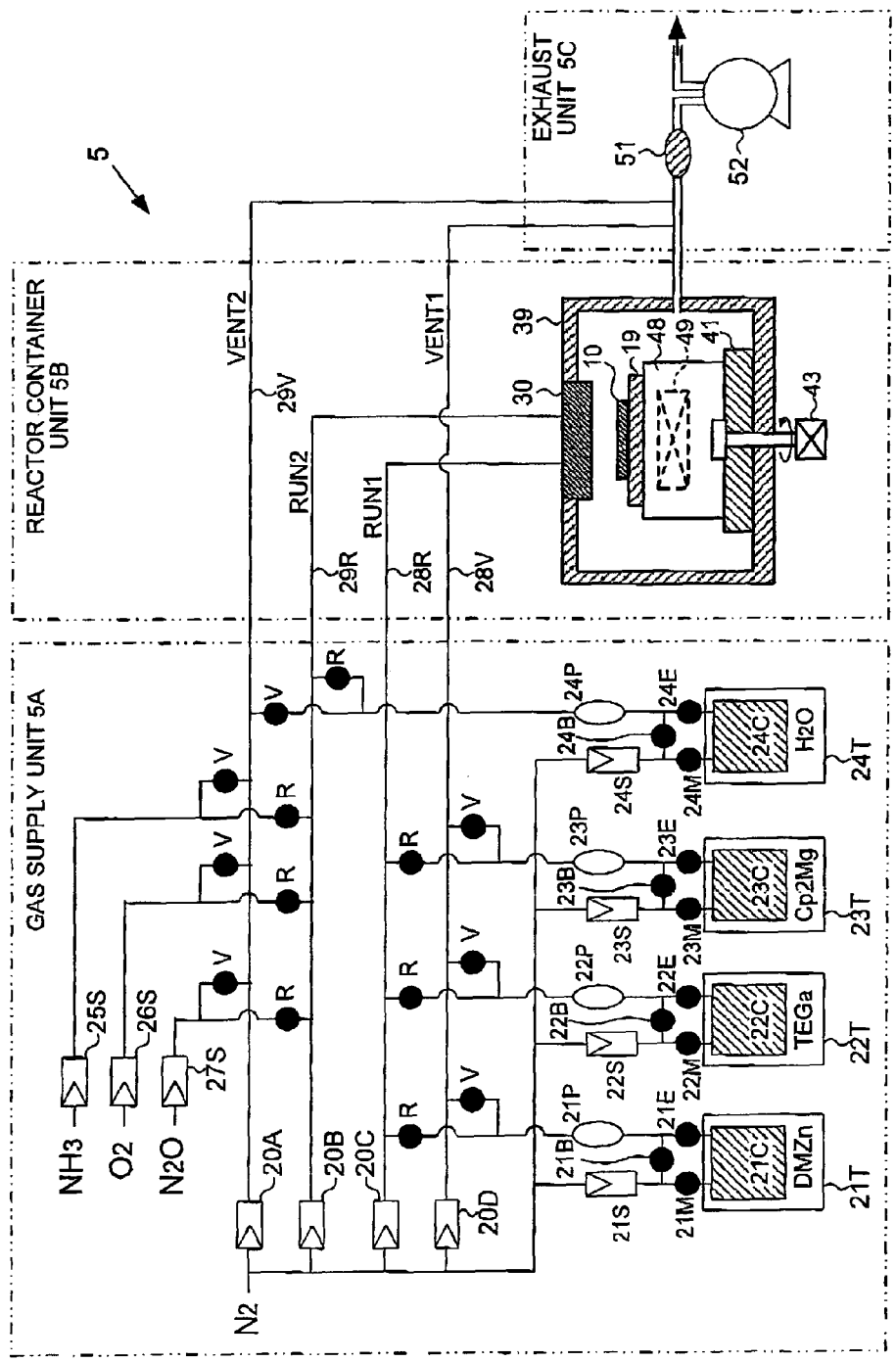
FIG. 1 is a view schematically showing a configuration of an MOCVD apparatus used for crystal growth.

FIG. 1 schematically shows a configuration of an MOCVD apparatus 5 used for crystal growth. Particulars about an apparatus configuration of the MOCVD apparatus 5 will be described hereinafter. Further, a crystal growth material will be described later in detail.

[Apparatus Configuration]

The MOCVD apparatus 5 includes a gas supply unit 5A, a reactor container unit 5B and an exhaust unit 5C. The gas supply unit 5A includes a portion that vaporizes a metalorganic (organometallic) compound material to be supplied, a portion that supplies a gaseous-material gas, and a transport unit including a function of transporting the gases.

The metalorganic compound material that is either a liquid or a solid substance at a room temperature is vaporized to be supplied. In the embodiment, DMZn (dimethyl zinc) is used as a Zinc (Zn) source, a Cp2Mg (bis-cyclopentadienyl magnesium) is used as a magnesium (Mg) source, and TEGa (triethylgallium) is used as a gallium (Ga) source, respectively.

Supply of DMZn will be first described. As shown in FIG. 1, a flow rate adjustment device (i.e., a mass flow controller) 21S adjusts a nitrogen gas to have a predetermined flow rate to be supplied to a DMZn storing container 21C through a gas supply valve 21M, whereby DMZn vapor is saturated in the nitrogen gas. Further, the DMZn saturated nitrogen gas is supplied, through an outlet valve 21E and a pressure adjustment device 21P, to a first vent pipe (which will be referred to as a first VENT line (VENT1) hereinafter) 28V in a growth standby mode, and to a first run pipe (which will be referred to as a first RUN line (RUN1) hereinafter) 28R in a growth mode. It is to be noted that the pressure adjustment device 21P adjusts a pressure in the storing container constant. Additionally, the DMZn storing container is maintained at a fixed temperature by a thermostatic bath 21T.

Further, the other metalorganic compound materials Cp2Mg and TEGa are likewise processed. That is, the nitrogen gas with a predetermined flow rate having passed through each of flow rate adjustment devices 22S and 23S is supplied to each of storing containers 22C (Cp2Mg) and 23C (TEGa) that store these materials, and each of these gases is supplied to the first VENT line (VENT1) 28V through an outlet valve 22E or 23E and a pressure adjustment device 22P or 23P in the growth standby mode or supplied to the first RUN line (RUN1) 28R through the same in the growth mode.

Further, with regard to H$_2$O (water vapor) which is a liquid material as an oxygen source, the nitrogen gas with a predetermined flow rate having passed through a flow rate adjustment device 24S is supplied to a storing container 24C, and the gas is supplied to a second vent pipe (which will be referred to as a second VENT line (VENT2) hereinafter) 29V through an outlet valve 24E and a pressure adjustment device 24P in the growth standby mode or supplied to a second run pipe (which will be referred to as a second RUN line (RUN2) hereinafter) 29R through the same in the growth mode.

As a p-type impurity source, an NH$_3$ (ammonia) gas that is a gaseous material is used. The NH$_3$ gas with a predetermined flow rate is supplied by a flow rate adjustment device 25S. This gas is supplied to the second VENT line (VENT2) 29V in the standby mode, and it is supplied to the second RUN line (RUN2) 29R in the growth mode. It is to be noted that this gas may be diluted with an inert gas such as nitrogen or Ar (argon).

The vapor of the liquid or solid material and the gaseous-material (which will be referred to as material gases) are supplied to a shower head 30 in the reactor container unit 5B through the first RUN line (RUN1) 28R and the second RUN line (RUN2) 29R. It is to be noted that flow rate adjustment devices 20C and 20B are provided to the first RUN line (RUN1) 28R and the second RUN line (RUN2) 29R, respectively, and the material gases are transported to the shower head 30 disposed to an upper portion of a reactor (or a chamber) 39 by a carrier gas (the nitrogen gas).

It is to be noted that the shower head 30 has an ejection surface facing a main surface (i.e., a growth surface) of a substrate 10 and many (e.g., several tens to hundred) ejection holes for the material gas are formed in the ejection surface in column and row directions. Furthermore, an effective ejection diameter of the ejection surface is φ75 mm.

The ejection holes include first ejection holes from which the metalorganic compound material gas (a group-II gas) supplied from the first RUN line (RUN1) 28R is ejected and second ejection holes from which H$_2$O (water vapor) (a group-VI gas) supplied from the second RUN line (RUN2) 28R is ejected. Further, the gas from the first RUN line 28R and the gas from the second RUN line 29R are ejected from the first ejection holes and the second ejection holes without being mixed with each other. The number of the first ejection holes is substantially equal to that of the second ejection holes, and these holes are provided at intervals of several mm and alternately arranged in respective columns and respective rows so that the ejected metalorganic compound material gas and H$_2$O can be uniformly mixed.

The shower head 30 that sprays or ejects the material gases toward the substrate 10, the substrate 10, a susceptor 19 that holds the substrate 10, and a heater 49 that heats the susceptor 19 are disposed in the reactor 39. Furthermore, the heater 49 is configured to heat the substrate from a room temperature to approximately 1100° C.

It is to be noted that a substrate temperature in the embodiments means a surface temperature of the susceptor 19 on which the substrate is mounted. Specifically, in case of the MOCVD method, heat transfer from the susceptor 19 to the substrate 10 is effected by direct contact and a gas that is present between the susceptor 19 and the substrate 10. In a growth pressure range of 1 kPa to 120 kPa (Pa: pascal) used in the embodiments, a surface temperature of the substrate 10 is approximately 0° C. to 10° C. lower than a surface temperature of the susceptor 19.

Moreover, a rotation mechanism which rotates the susceptor 19 is provided in the reactor 39. In more detail, the susceptor 19 is supported by a susceptor support cylinder 48, and the susceptor support cylinder 48 is rotatably supported on a stage 41. Additionally, when a rotary motor 43 rotates the susceptor support cylinder 48, the susceptor 19 (i.e., the substrate 10) is rotated. It is to be noted that the heater 49 is disposed in the susceptor support cylinder 48.

The exhaust unit 5C is constituted of an in-container pressure adjustment device 51 and an exhaust pump 52 and configured to adjust a pressure in the reactor 39 from approximately 0.01 kPa to 120 kPa by using the in-container pressure adjustment device 51.

[Material for Crystal Growth]

In the embodiments, as the metalorganic compound material, a material that does not contain oxygen in constituent molecules is used. The metalorganic material that does not contain oxygen has high reactivity with water vapor (an oxygen material or an oxygen source) and enables growth of a ZnO-based crystal even in a region having a low growth pressure or having a low flow ratio ($F_{H2O}/F_{MO}$ ratio) or a low VI/II ratio of the water vapor and the metalorganic material (MO).

Although DMZn, Cp2Mg and TEGa (a high-purity product for a semiconductor material) are used in the embodiments, DEZn (diethyl zinc), MeCp2Mg (bis-methylpentadienyl magnesium), EtCp2Mg (bis-ethylpentadienyl magnesium) and the like can be utilized. Further, as a group-III material, TMGa (trimethylgallium), TMAl (trimethylaluminum), TEAl (triethylaluminum), TIBA (triisobutylaluminum) and the like can be used.

As an oxygen material (which will be also referred to as an oxygen source hereinafter), a polar oxygen material (a polar oxygen source) is suitable. In particular, $H_2O$ (water vapor) has an excellent adsorption capability with respect to an oxide crystal surface since a side where a hydrogen atom is coupled in a molecule and a lone-pair electron side are largely polarized to $\delta^+$ and $\delta^-$.

Furthermore, an $H_2O$ molecule has hydrogen atomic bonds and lone-pair electrons forming a tetrahedral structure, and it is an excellent oxygen source that preferentially performs oriented adsorption to an oxygen site in oxide crystal growth of a $sp^3$ type hybrid orbital zincblende structure (Zincblende/Cubic) or a wurtzite structure (Wurtzeite/Hexagonal). As other oxygen sources, likewise, lower alcohols in which a dipole moment is large and an O atom takes the $sp^3$ type hybrid orbital may be used. That is, specifically, besides $H_2O$ (water vapor), lower alcohols, especially lower alcohols of which carbon number is 1 to 5 such as methanol, ethanol, propanol, butanol or pentanol can be utilized as oxygen sources. It is to be noted that $H_2O$ (extra-pure water: manufactured by Kanto Chemical Co., Inc., standard: Ultrapur) is used in the embodiments and $O_2$ (oxygen) and $N_2O$ (a nitrogen monoxide) are used in Comparative Examples.

As a p-type impurity material, a compound that can be readily substituted to an O (oxygen) site of a zincblende structure or a wurtzite structure in a crystal growth process is suitable. In particular, $NH_3$ is suitable since it has the same effect as $H_2O$. Specifically, as the p-type impurity material, hydrazines such as $NH_3$ (ammonia), $(CH_3)_2NNH_2$ (dimethylhydrazine) or $(CH_3)NHNH_2$ (monomethylhydrazine), an alkyl phosphorous compound such as $R_1PH_2$, $R_2PH$ or $R_3P$, or an alkyl arsenic compound such as $AsH_3$, $R_1AsH_2$, $R_2AsH$ or $R_3As$ can be utilized.

As a carrier gas (or atmosphere gas), an inert gas that does not react with each of the above-described crystal growth materials is suitable. Moreover, a gas that does not obstruct adsorption of the crystal growth material such as $H_2O$ (water vapor) or $NH_3$ with the substrate surface is preferable. Specifically, as the carrier gas and an ambient or atmosphere gas, an inert gas such as He (helium), Ne (neon), Ar (argon), Kr (krypton), Xe (xenon) or $N_2$ (nitrogen) can be utilized.

In the first embodiment of the invention, an $N_2$ (nitrogen) gas of the JIS (Japanese Industrial Standard) grade-1 having a residual $O_2$ concentration that is less than 5 ppm was used. Additionally, an ultrahigh-purity $N_2$ gas having a residual $O_2$ concentration that is less than 0.1 ppm was used in the second embodiment of the invention, and an ultrahigh-purity $N_2$ gas having a residual $O_2$ concentration that is less than 1 ppb was used in the third embodiment of the invention and Comparative Examples 1 to 3.

It is to be noted that $N_2$ (nitrogen) is usually manufactured by rectification based on liquefaction and evaporation of air. Therefore, $O_2$ (oxygen) is contained as a residual impurity. A JIS grade-1 product contains oxygen that is not greater than 5 ppm, and an ultrahigh-purity product (the ultrahigh-purity $N_2$) contains oxygen that is less than 0.1 ppm. Further, the purity of the ultrahigh-purity $N_2$ can be increased to be less than 1 ppb by using a refiner.

The ZnO (zinc oxide) substrate is a crystal having a wurtzite structure, and there are c-plane or a {0001} plane, an a-plane or a {11-20} plane, an m-plane or a {10-10} plane, and an r-plane or a {10-12} plane as typical substrate cut planes Moreover, as the c-planes, there are a Zn-polar plane (i.e., +c plane) and an O-polar plane (i.e., −c plane).

In each of the embodiments of the invention and comparative examples described below, a ZnO single crystal substrate sliced out from an ingot manufactured by a hydrothermal method was used. It is to be noted that a substrate having a residual Li concentration reduced by a treatment such as a high-temperature heat treatment (equal or more than 1000° C.) was used.

Additionally, as the ZnO single crystal substrate 10, a substrate (which will be also referred to as a c-plane ZnO single crystal substrate hereinafter) whose substrate main plane (i.e., a crystal growth plane) is a Zn polar plane (i.e., +c plane) is preferable. In each of the following embodiments and comparative examples, a substrate whose crystal growth plane is a Zn polar plane was used. Further, a substrate whose substrate main plane (a crystal growth plane) is inclined to one of an a-axis and an m-axis is preferable. In each of the following embodiments and comparative examples, a so-called 0.5°-off substrate whose (0001) plane is inclined to a [10-10] direction at 0.5° (or a 0.5°-off substrate whose c-plane is inclined to the m-axis direction at) 0.5° was utilized.

Furthermore, in each of the following embodiments and comparative examples, a ZnO single crystal substrate whose FWHM (a full width at half maximum) of an XRD(100)ω rocking curve is less than 40 arcsec was used.

[ZnO Single Crystal Growth Method]

In this embodiment, a ZnO single crystal substrate whose FWHN of an XRD(100)ω rocking curve was less than 40 arcsec was selected since the damage layer of the substrate was assumed to be thin. The selected substrate was subject to etching to remove the damage layer. As an etchant, a mixed solution obtained by mixing a solution containing 0.2 mol/L of EDTA·2Na (ethylene-diamine-tetra-acetic acid disodium salt) with a solution containing 99% of EDA (ethylene diamine) with a ratio of 20:1 was used. An etching rate of this etchant (EDTA·2Na:EDA=20:1) is 0.7 μm/h. It is to be noted that this etchant is disclosed in Japanese Patent Application Laid-open No. 2007-1787. Further, a mixing ratio of the etchant can be approximately 5:1 to 30:1, and etching can be excellently performed with this ratio.

The substrate was immersed in the etchant at a room temperature for 20 min (minutes) to etch a surface layer thereof Then, the etchant was removed by water washing, and dewatering was performed by organic solvent cleaning (acetone or alcohol). At last, the organic solvent was heated, and drying was carried out in a vapor atmosphere. It is to be noted that etching conditions, e.g., a temperature, a time and the like vary depending on a substrate surface treatment and a storage state of the substrate.

Figure 2:
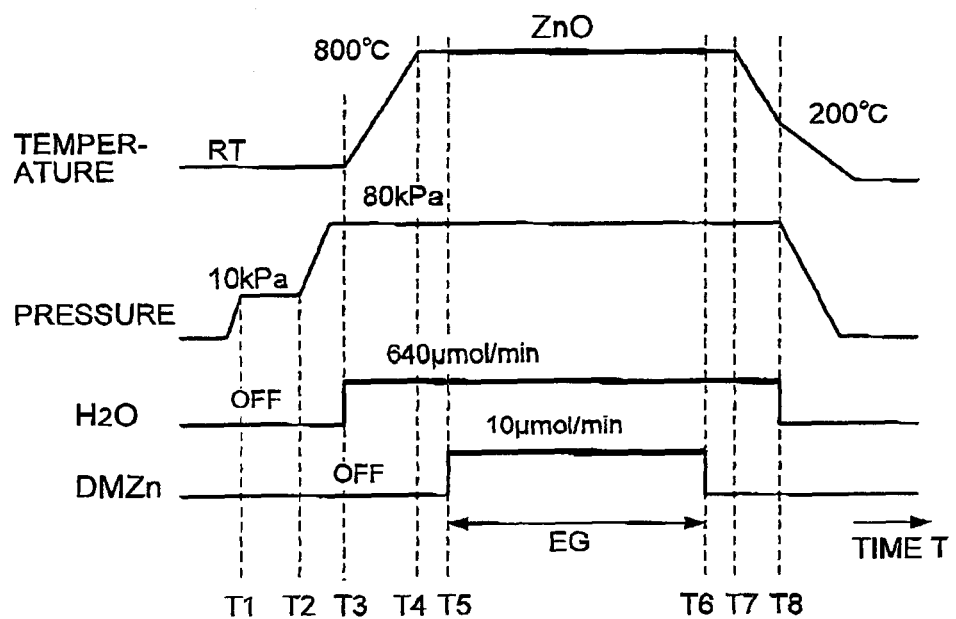
FIG. 2 is a view showing a crystal growth sequence according to a first embodiment of the invention.

The growth method according to the embodiment will now be described hereinafter in detail with reference to a crystal growth sequence shown in FIG. 2.

The ZnO single crystal substrate (which will be referred to as a ZnO substrate or simply a substrate hereinafter) 10 after etching the surface layer was set on the susceptor 19 in the reactor 39, air was exhausted to form a vacuum, and then a pressure in the reactor was adjusted to 10 kPa (at a time T=T1). Moreover, the ZnO substrate 10 was rotated at 10 rpm by the rotation mechanism.

Then, a nitrogen ($N_2$) gas was supplied to the shower head 30 from each of the first RUN line (RUN1) 28R and the second RUN line (RUN2) 29R with a flow rate of 2000 cc/min (4000 cc/min in total) to be sprayed or ejected onto the ZnO substrate 10. Additionally, in this embodiment, a product of the JIS standard grade-1 (a residual O2 concentration$\leqq$5 ppm) was utilized as the nitrogen gas.

It is to be noted that, the gas flow rate supplied to the shower head 30 from the first RUN line (RUN1) 28R and the second RUN line (RUN2) 29R was maintained constant. That is, when supplying a metalorganic material gas and a gaseous material in, e.g., a growth standby mode and a growth mode, a flow rate of each of the flow rate adjustment devices 20C and 20B provided to the first RUN line (RUN1) 28R and the second RUN line (RUN2) 29R was increased or decreased by an amount corresponding to the flow rate of each of metalorganic material gas and the gaseous material, thereby maintaining the gas flow rate supplied to the shower head 30 constant.

Then, the pressure in the reactor 39 was increased from 10 kPa (T=T2). After the pressure was stabilized at 80 kPa, a substrate temperature was started to increase from a room temperature (RT), and $H_2O$ (water vapor) was adjusted to have a flow rate ($F_{H2O}$) of 640 μmol/min and was sprayed onto the ZnO substrate 10 from the second RUN line (RUN2) 29R (T=T3).

After the substrate temperature reached a predetermined high growth temperature Tg (Tg=800° C. in this embodiment) (T=T4), the operation waited for one minute, and a flow rate ($F_{DMZn}$) of DMZn was adjusted to 10 μmol/min to be sprayed onto the ZnO substrate 10 from the shower head 30 through the first RUN line (RUN1) 28R to start crystal growth (T=T5). It is to be noted that, since the nitrogen gas ($N_2$) as a carrier gas was sprayed onto the entire surface of the ZnO substrate 10 from the shower head 30 to carry out the crystal growth, an $O_2$ concentration in a growth atmosphere is equal to a residual $O_2$ concentration in the carrier gas. That is, in this embodiment, the $O_2$ concentration in the growth atmosphere is not greater than 5 ppm. Furthermore, this is likewise applied to the following embodiments and comparative examples.

Figure 3:
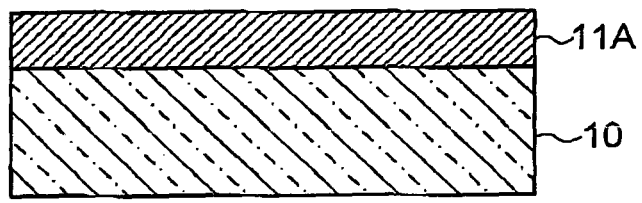
FIG. 3 is a cross-sectional view showing a configuration of a growth layer according to the first embodiment of the invention having a ZnO single crystal layer grown on a substrate.

When a period of 60 min elapsed (T=T6) from the growth start (T=T5), DMZn was switched from the first RUN line 28R to the first VENT line 28V to terminate the growth. The growth was carried out for 60 min as described above (i.e., a growth time EG=60 min) to form an undoped ZnO single crystal layer 11A having a thickness of approximately 1 μm (micrometer) as depicted in a cross-sectional view of FIG. 3. It is to be noted that the predetermined high growth temperature used herein means a temperature (a high temperature) at which the growth in a thermostable state (or a thermal equilibrium state) is effected, and the single crystal was grown based on the high-temperature growth (Tg=800° C.). It is to be noted that the definition of "the thermostable state (or the thermal equilibrium state)" will be described later.

After the termination of the growth, the pressure was maintained at 80 kPa, and cooling was carried out while flowing the water vapor ($H_2O$) until the substrate temperature drops to 200° C. (T=T7 to T8). Then, the pressure was reduced to a pump vacuum (to approximately $10^{-1}$ Pa), and the supply of $H_2O$ was stopped at the same time. The operation waited until the substrate temperature reaches the room temperature and then the growth process was terminated. It is to be noted that the reduction of pressure and the stop of $H_2O$ supply during cooling may be carried out after the substrate reaches the room temperature (RT).

As described above, in the first embodiment of the invention,
(1) the ZnO single crystal substrate having the thin damage layer, i.e., the ZnO single crystal substrate whose FWHM of the XRD(100)ω rocking curve is less than 40 arcsec was utilized;
(2) the substrate was etched (20 min) to remove the damage layer;
(3) the nitrogen ($N_2$) gas having the low residual $O_2$ concentration (i.e., of the JIS grade 1, the residual $O_2$ concentration$\leqq$5 ppm) was used as the carrier gas (i.e., the ambient $O_2$ concentration$\leqq$5 ppm);
(4) water vapor ($H_2O$) and the metalorganic compound which does not contain oxygen were used as the material, gases; and
(5) the ZnO single crystal was grown at the high growth temperature (Tg=800° C.).

Second Embodiment

Figure 4:
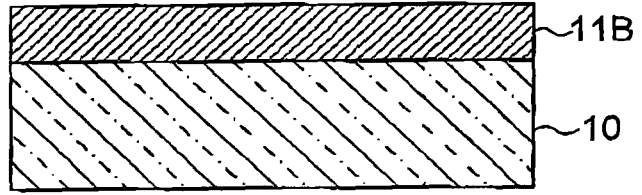
FIG. 4 is a cross-sectional view showing a configuration of a growth layer according to a second embodiment of the invention having a ZnO single crystal layer grown on a substrate.

The above-described MOCVD apparatus was utilized to grow a ZnO single crystal on a ZnO single crystal substrate. In this embodiment, an ultrahigh-purity nitrogen ($N_2$) gas whose residual $O_2$ concentration is less than 0.1 ppm was used as a carrier gas. Moreover, a growth time (FIG. 2, EG) was set to 25 min, and an undoped ZnO single crystal layer 11B having a thickness of approximately 0.4 μm was formed as shown in FIG. 4.

It is to be noted that, besides the above-described points, a growth method including the ZnO single crystal substrate, a substrate etching treatment, a growth material, a growth sequence (FIG. 2), growth conditions and the like is the same as that in the first embodiment of the invention.

That is, in the second embodiment,
(1) the ZnO single crystal substrate whose FWHM of an XRD(100)ω rocking curve is less than 40 arcsec was used;
(2) the substrate was etched (20 min) to remove a damage layer;
(3) the nitrogen ($N_2$) gas whose residual $O_2$ concentration is less than 1 ppm was used as the carrier (atmospheric) gas (i.e., the ambient $O_2$ concentration<0.1 ppm);
(4) water vapor ($H_2O$) and the metalorganic compound which does not contain oxygen were used; and
(5) the ZnO single crystal was grown at the high growth-temperature (Tg=800° C.).

Third Embodiment

In this embodiment, the above-described MOCVD apparatus was used to grow a ZnO single crystal on a ZnO single crystal substrate and grow a ZnO-based single crystal ($Mg_xZn_{(1-x)}O$, x=0.40) on the ZnO single crystal.

Figure 5:
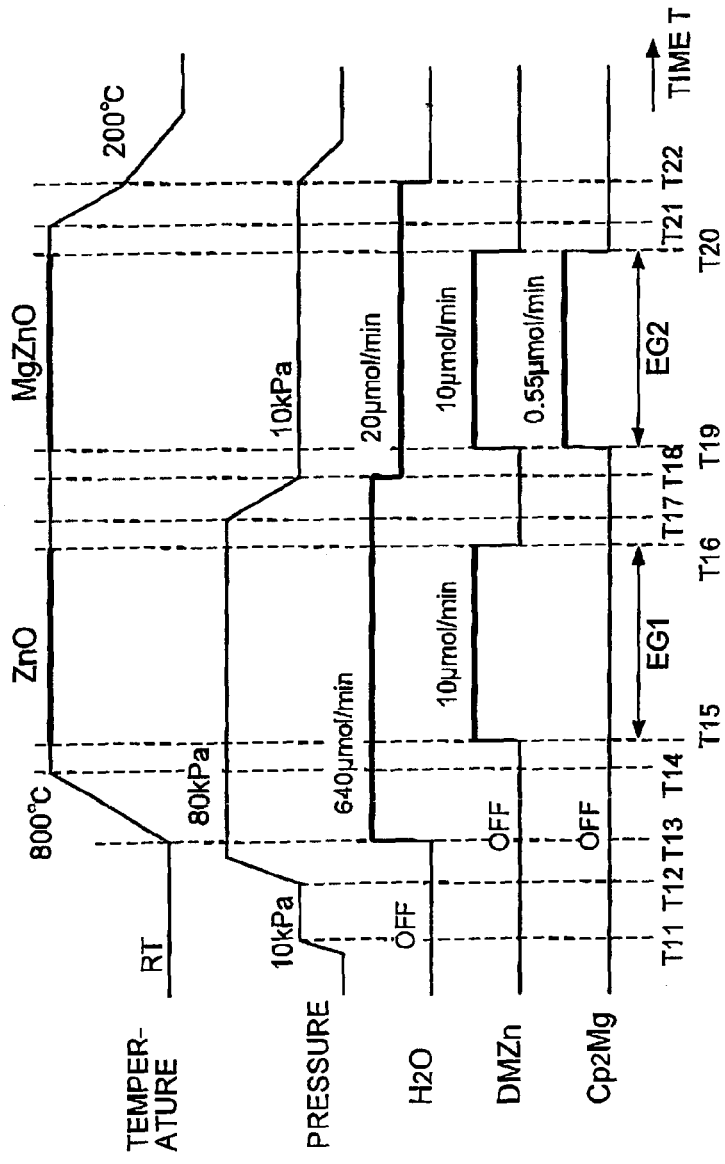
FIG. 5 is a view showing a crystal growth sequence according to the second embodiment of the invention.

This embodiment is equal to the first and second embodiments of the invention in that a ZnO single crystal substrate whose FWHM of an XRD(100)ω rocking curve is less than 40 arcsec was used as the substrate and a surface layer was etched at a room temperature for 20 min. The growth method according to this embodiment will now be described hereinafter in detail with reference to a crystal growth sequence depicted in FIG. 5.

A ZnO single crystal substrate 10 after etching the surface layer was set on the susceptor 19, and a pressure in the reactor was adjusted to 10 kPa (a time T=T11). Additionally, the ZnO substrate 10 was rotated at 10 rpm by a rotation mechanism.

Then, a nitrogen ($N_2$) gas was supplied to the shower head 30 from each of the first RUN line (RUN1) 28R and the second RUN line (RUN2) 29R with a flow rate of 2000 cc/min (4000 cc/min in total) and to be sprayed onto the ZnO substrate 10.

It is to be noted that, in this embodiment, a gas having purity increased to set a residual $O_2$ concentration to be less than 1 ppb (the residual $O_2$ concentration<1 ppb) by passing ultrahigh-purity N2 to a refiner was utilized as the carrier gas.

Additionally, like the first embodiment and the second embodiment of the invention, a total flow rate of the gas supplied to the shower head 30 from the first RUN line (RUN1) 28R and the second RUN line (RUN2) 29R was maintained constant in a growth standby mode and a growth mode and during a fixed period after the end of growth.

Then, the pressure in the reactor 39 was increased from 10 kPa (T=T12). After the pressure was stabilized at 80 kPa, a substrate temperature was started to increase from a room temperature (RT), and a flow rate ($F_{H2O}$) of $H_2O$ (water vapor) was adjusted to 640 μmol/min, and spray was effected onto the ZnO substrate 10 from the second RUN line (RUN2) 29R (T=T13).

The operation waited for one minute after the substrate temperature reached a predetermined growth temperature Tg (Tg=800° C. in this embodiment) (T=T14), a flow rate ($F_{DMZn}$) of DMZn was adjusted to 10 μmol/min, and spray was carried out onto the ZnO substrate 10 from the shower head 30 through the first RUN line (RUN1) 28R to start crystal growth (T=T15).

When a period of 4.5 min lapsed (T=T16) after the growth start (T=T15), DMZn was switched from the first RUN line (RUN1) 28R to the first VENT line (VENT1) 28V to terminate the growth. As described above, the growth was carried out for 4.5 min as the growth time (EG1), thereby forming an undoped ZnO single crystal layer 11C having a thickness of approximately 70 nm (nanometers).

After switching DMZn to the first VENT line (VENT1) 28V, the operation waited for one minute, and the pressure was reduced to 10 kPa (T=T17 to T18). It is to be noted that the flow rate of $H_2O$ (water vapor) was maintained at 640 μmol/min during this period. When the pressure reached 10 kPa (T=T18), the flow rate of $H_2O$ (water vapor) was adjusted to 20 μmol/min, and spray was performed from the second RUN line (RUN2) 29R onto the ZnO substrate 10. Subsequently, the operation waited for one minute to achieve a stable state, then the flow rate of DMZn was adjusted to 10 μmol/min, a flow rate ($F_{CP2Mg}$) of $Cp_2Mg$ was adjusted to 0.55 μmol/min, and the gases were sprayed from the shower head 30 onto the ZnO substrate 10 through the first RUN line (RUN1) 28R to start crystal growth (T=T19).

Figure 6:
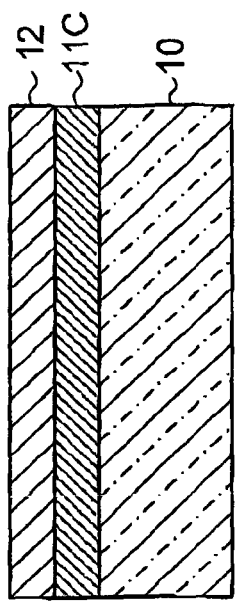
FIG. 6 is a cross-sectional view showing a configuration of a growth layer according to a third embodiment of the invention having a ZnO single crystal layer and a ZnO-based single crystal layer grown on a substrate.

When a period of 40 min elapsed (T=T20) from the growth start, DMZn and $Cp_2Mg$ were switched from the first RUN line (RUN1) 28R to the first VENT line (VENT1) 28V to terminate the growth. As described above, the growth was carried out for 40 min as a growth time (EG2) under conditions that the pressure and the water vapor flow rate are lower than those for the ZnO single crystal layer 11C, thereby forming an undoped $Mg_xZn_{(1-x)}O$ (x=0.40) single crystal layer 12 having a thickness of approximately 70 nm as shown in FIG. 6. It is to be noted that the undoped ZnO single crystal layer 11C and the undoped $Mg_xZn_{(1-x)}O$ (x=0.40) single crystal layer 12 were grown while maintaining the growth temperature Tg (=800° C.) (T=T14 to T21).

After the end of growth, the pressure was maintained at 10 kPa, cooling was performed while flowing the water vapor ($H_2O$) until the substrate temperature reaches 200° C. (T=T21 to T22). Thereafter, the pressure was reduced to a pump vacuum (to approximately $10^{-1}$ Pa), and the supply of $H_2O$ was stopped at the same time. The operation was waited until the substrate reaches the room temperature, and then the growth sequence was terminated.

It is to be noted that the predetermined growth temperature used herein means a temperature (a high temperature) at which growth in a thermostable state (or a thermal equilibrium state) is performed, and the single crystal layers 11C and 12 were grown through the high-temperature growth (Tg=800° C.).

Further, in this embodiment, the MgZnO crystal was grown under conditions of the lower pressure (a reduced pressure) and the lower water vapor flow rate than those for the crystal containing no Mg (i.e., the ZnO crystal) for the following reasons. That is, when the growth is carried out under a low pressure (10 kPa), a gas concentration is reduced, thereby the growth rate can be decreased. Furthermore, when a low water vapor flow rate is adopted, unnecessary reaction with a metalorganic material can be suppressed. Thus, conditions that the grow rate is lowered and the pressure and the water vapor flow rate are reduced to suppress the unnecessary reaction are particularly suitable for the growth of the MgZnO crystal layer having strain, and they are effective for suppressing introduction of defects or dislocation. Moreover, since a water vapor supply amount (i.e., an integral value) for a growth layer thickness increases when the growth rate is lowered, the MgZnO single crystal layer having no defect (oxygen deficiency in particular) can be grown even in environments with the low pressure and the low water vapor flow rate.

As described above, in the third embodiment of the invention, (1) the ZnO single crystal substrate having the thin damage layer, i.e., the ZnO single crystal substrate whose FWHM of the XRD(100)ω rocking curve is less than 40 arcsec was used;
(2) the substrate was etched (20 min) to remove the damage layer;
(3) the nitrogen ($N_2$) gas having the very low residual $O_2$ concentration (the residual $O_2$ concentration<1 ppb) obtained by passing the ultrahigh-purity nitrogen gas to the refiner was used as the carrier gas;
(4) water vapor and the metalorganic compound (DMZn, $Cp_2Mg$) which does not contain oxygen were used as the material gases: and
(5) the ZnO single crystal was grown at high-temperature (Tg=800° C.) which is enough for providing growth in a thermostable state, and the ZnO-based single crystal (i.e., $Mg_xZn_{(1-x)}O$, x=0.40) was grown tinder the conditions of the lower pressure and the lower water vapor flow rate than those for growing the ZnO single crystal.

According to each of the first to third embodiments of the invention, the ZnO-based single crystal layer, which is superior in flatness and crystal orientation and in which no substrate impurity is accumulated in an interface between the substrate and the ZnO-based single crystal layer and no substrate impurity diffuses in the ZnO-based single crystal layer was obtained. In particular, it was confirmed that the MgZnO layer grown with the low water vapor flow rate under the low pressure has excellent crystallinity. Detailed evaluation results, physical properties and the like of these crystal growth layers will be described later.

Comparative Examples 1 to 31

To evaluate the ZnO-based single crystal layer grown according to each of the first to third embodiments of the invention, crystal growth was carried out based on the following growth methods and growth conditions as comparative examples.

Comparative Example-1: CMP1

This comparative example is the same as the first to third embodiments in that a ZnO single crystal substrate whose FWHM of an XRD(100)ω rocking curve was less than 40 arcsec was used as a substrate and a surface layer was etched at a room temperature for 20 min. A growth method according to Comparative Example-1 will now be described hereinafter in detail with reference to a crystal growth sequence depicted in FIG. 7. It is to be noted that points different from the first to third embodiments of the invention will be mainly explained.

First, a ZnO single crystal substrate 10 was set on the susceptor 19, and a pressure in the reactor was adjusted to 10 kPa (a time T=T41). Further, the ZnO substrate 10 was rotated at 10 rpm by the rotation mechanism.

Subsequently, a nitrogen ($N_2$) gas was supplied to the shower head 30 from each of the first RUN line (RUN1) 28R and the second RUN line (RUN2) 29R with a flow rate of 2000 cc/min (4000 cc/min in total) to be sprayed onto the ZnO substrate 10. It is to be noted that the $N_2$ gas having purity increased by a refiner, that is, a residual $O_2$ concentration to be less than 1 ppb (the residual $O_2$ concentration<1 ppb) was used in Comparative Example-1. Furthermore, a total flow rate of the gas supplied from the first RUN line 28R and the second RUN line 29R to the shower head 30 was maintained constant at a fixed flow rate like the first to third embodiments of the invention.

Then, a substrate temperature was started to increase from a room temperature (RT) to 800° C. and, at the same time, a flow rate of $H_2O$ (water vapor) was adjusted to 640 μmol/min to perform spray onto the ZnO substrate 10 from the second RUN line 29R (T=T42). After the substrate temperature reached 800° C., the temperature was maintained for 10 minutes, thus a heat treatment of the substrate was carried out (T=T43 to T44).

Figure 7:
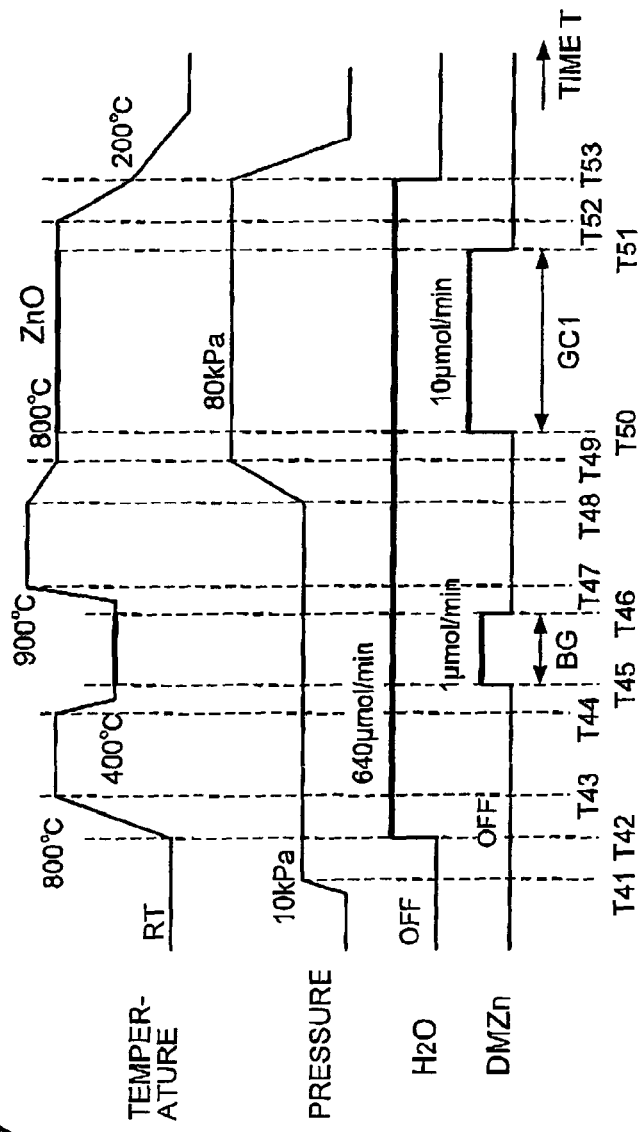
FIG. 7 is a view showing a crystal growth sequence used in Comparative Example-1.
Figure 8:
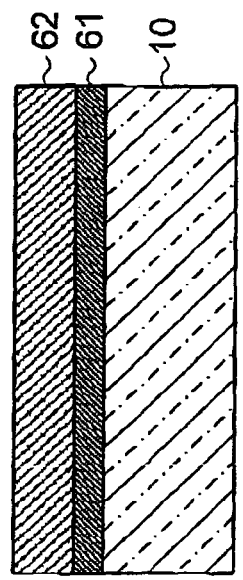
FIG. 8 is a cross-sectional view showing a configuration of a growth layer according to Comparative Example-1 having a buffer layer and a ZnO single crystal layer grown on a substrate.

The substrate temperature was reduced from 800° C., the control waited for one minute after reaching a predetermined temperature (i.e., a low temperature, Tb=400° C.), a flow rate of DMZn was adjusted to 1 μmol/min, and a low-temperature buffer layer 61 was grown. As shown in FIG. 8, a low-temperature ZnO single crystal layer (LT-ZnO) having a layer thickness of approximately 25 nm was grown as the buffer layer 61 with a growth time of 15 minutes (FIG. 7, BG) (T=T45 to T46).

Then, the temperature of the substrate was increased to 900° C., and then the temperature was maintained for 10 minutes. Thus, the buffer layer 61 was subjected to a heat treatment or annealing (900° C., 10 minutes) (T=T47 to T48) to restore crystallinity and flatness of the buffer layer 61.

The pressure was increased from 10 kPa to 80 kPa and, at the same time, the substrate temperature was reduced to 800° C. (T=T48 to T49). After the pressure reached 80 kPa and the temperature reached 800° C., the operation waited for one minute, and a flow rate of DMZn was adjusted to 10 μmol/min to start crystal growth (T=T50). A ZnO single crystal layer 62 having a thickness of approximately 0.57 μm was formed on the buffer layer 61 (FIG. 8) by 35-minute growth (FIG. 7, GC1, T=T50 to T51).

A series of processes, i.e., cooling after the end of growth (T=T52 to T53), a reduction of pressure to produce a vacuum, stop of water vapor supply and the like are equal to those in the first to third embodiments of the invention.

As described above, in Comparative Example-1,
(i) a ZnO single crystal substrate whose FWHM of the XRD (100)ω rocking curve is less than 40 arcsec was used;
(ii) the substrate was etched (20 min);
(iii) the nitrogen ($N_2$) gas having the very low residual $O_2$ concentration (i.e., the residual $O_2$ concentration<1 ppb) was utilized as the carrier gas;
(iv) $H_2O$ (water vapor) and the metalorganic compound containing no oxygen were used as the material gases;
(v) the substrate heat treatment ($T_{anl}$=800° C.) was carried out;
(vi) the buffer layer was formed based on the low-temperature growth ($T_{buf}$=400° C.), and the buffer layer was annealed ($T_{cry}$=900° C.); and
(vii) the ZnO crystal was grown on the buffer layer based on the high-temperature growth (Tg=800° C.).

Comparative Examples-2 and -3

In each of Comparative Examples-2 and -3, a ZnO crystal layer (CMP2 and CMP3, respectively) was grown on a ZnO single crystal substrate. These comparative examples are the same as the first to third embodiments of the invention and Comparative Example-1 in that a ZnO single crystal substrate whose FWHM of an XRD(100)ω rocking curve was less than 40 arcsec was used as a substrate and a surface layer of the substrate was etched at a room temperature for 20 min. Growth methods according to Comparative Example-2 and Comparative Example-3 will now be described hereinafter with reference to crystal growth sequences in Comparative Example-2 and Comparative Example-3 depicted in FIG. 9 and FIG. 10, respectively.

In each of Comparative Example-2 and Comparative Example-3, a nitrogen ($N_2$) gas whose residual $O_2$ concentration is less than 1 ppb (the residual $O_2$ concentration<1 ppb) obtained by further refining an ultrahigh-purity nitrogen gas was used as a carrier gas. Further, a metalorganic compound (DMZn) containing no oxygen was used as a metalorganic material like the first to third embodiments and Comparative Example-1.

Oxygen sources used in Comparative Example-2 and Comparative Example-3 are different from those in the first to third embodiments of the invention and Comparative Example-1. That is, as the oxygen sources, an oxygen gas ($O_2$) was used in Comparative Example-2 and a nitrous oxide gas ($N_2O$) was utilized in Comparative Example-3.

Figure 9:
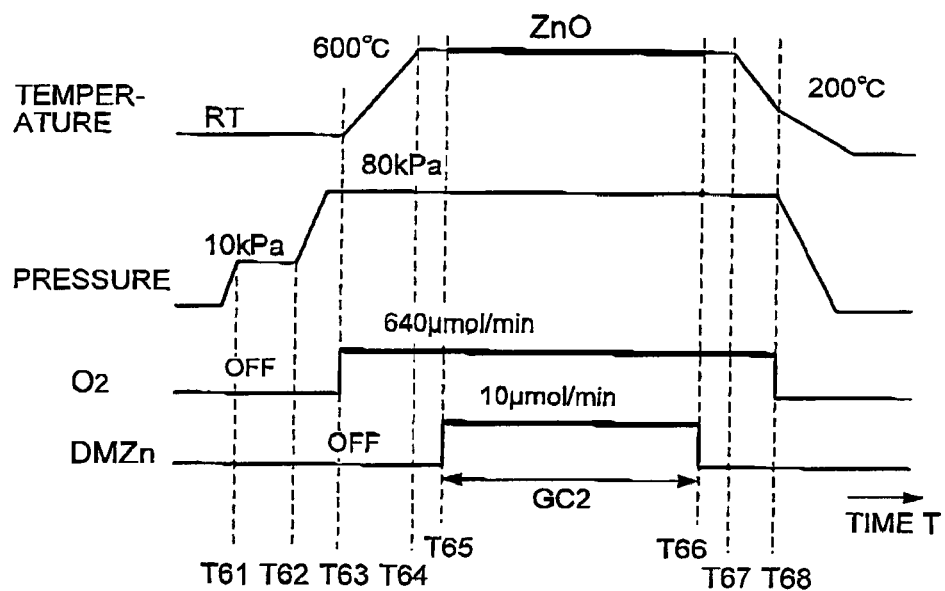
FIG. 9 is a view showing a crystal growth sequence used in Comparative Example-2.

FIG. 9 shows a crystal growth sequence in Comparative Example-2. As shown in FIG. 9, the crystal growth sequence in Comparative Example-2 is different from the crystal growth sequence (FIG. 2) in the first embodiment of the invention in that the substrate temperature was set to 600° C. to perform crystal growth as depicted in FIG. 9.

In more detail, a pressure in the reactor 39 was increased from 10 kPa (T=T61 to T62) to 80 kPa. Then, the substrate temperature was started to increase from a room temperature (RT) and, at the same time, a flow rate ($F_{O_2}$) of $O_2$ (an oxygen gas) was adjusted to 640 μmol/min, and spray was effected onto a ZnO substrate 10 from the shower head 30 through the second RUN line (RUN2) 29R (T=T63).

After the substrate temperature reached a growth temperature Tg (600° C.) (T=T64), the operation waited for one minute, a flow rate ($F_{DMZn}$) of $D_{MZn}$ was adjusted to 10 μmol/min, and spray was carried out onto the ZnO substrate 10 from the shower head 30 to start crystal growth. The growth was performed for 60 min (GC2=60 min) (T=T65 to T66), thereby forming an undoped ZnO single crystal layer having a thickness of 1 μm.

A series of processes, i.e., cooling after the end of growth, a reduction in pressure to form a vacuum, stop of water vapor supply and the like are equal to those in the first to third embodiments of the invention.

It is to be noted that, when $O_2$ was used as the oxygen source, the ZnO crystal was grown at the substrate temperature of approximately 400° C. or above, a crystal of a thermostable state (or thermostable-state crystal) was obtained at a temperature starting from approximately 500° C., and approximately 650° C. reached a growth upper limit temperature (a temperature at which crystal does not grow). In Comparative Example-1, the growth was performed at 600° C. that a (002)2θ-diffraction intensity of the XRD becomes maximum.

Figure 10:
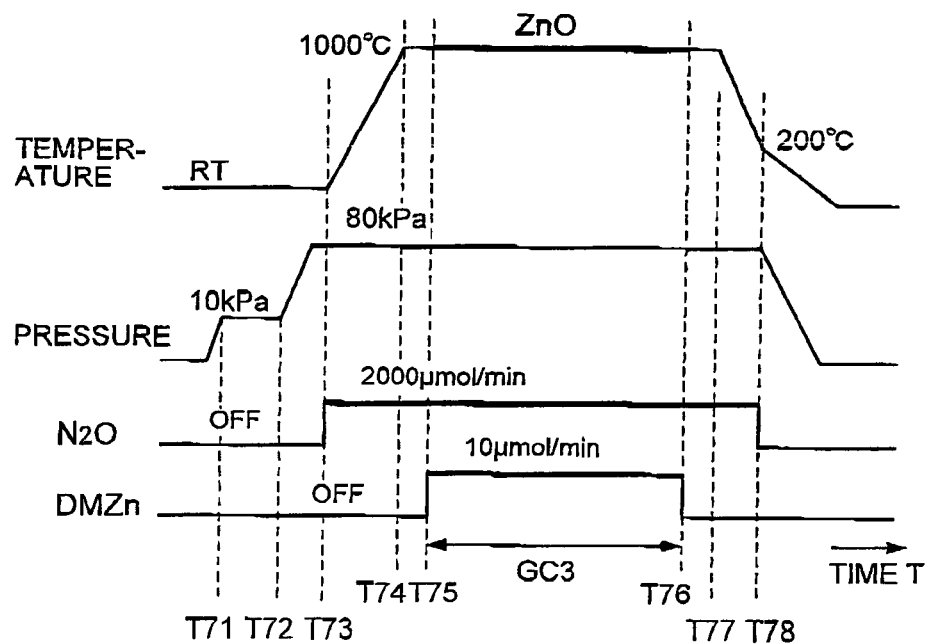
FIG. 10 is a view showing a crystal growth sequence used in Comparative Example-3.

FIG. 10 shows the crystal growth sequence in Comparative Example-3. As shown in FIG. 10, the crystal growth sequence of Comparative Example-3 is different from the crystal growth sequences of the first embodiment and Comparative Example-2 (FIG. 2, FIG. 9) in that a substrate temperature was set to 1000° C. to perform crystal growth.

In more detail, a pressure in the reactor 39 was increased from 10 kPa (T=T71 to T72) to 80 kPa. Subsequently, a substrate temperature was started to increase from a room temperature and at the same time, a flow rate ($F_{N_2O}$) of $N_2O$ (nitrous oxide gas) was adjusted to 20000 μmol/min, and spray was performed onto the ZnO substrate 10 from the shower head 30 through the second RUN line (RUN2) 29R (T=T73).

After the substrate temperature reached a growth temperature Tg (=1000° C.) (T=T74), the operation waited for one minute, a flow rate ($F_{DMZn}$) of DMZn was adjusted to 10 μmol/min, and spray was effected onto the ZnO substrate 10 from the shower head 30 to start crystal growth. The growth was performed for 60 minutes (GC3=60 min) (T=T75 to T76), thereby forming an undoped ZnO single crystal layer having a thickness of approximately 1 μm.

A series of processes, i.e., cooling after the end of growth, a reduction in pressure to form a vacuum, stop of water vapor supply and the like are equal to those in the first to third embodiments of the invention.

It is to be noted that, when $N_2O$ was used as the oxygen source, the ZnO crystal was grown at the substrate temperature equal to or above approximately 900° C. Since a growth start temperature was high, the crystal of a thermostable state was grown. In Comparative Example-3, the growth was performed at a growth limit temperature 1000° C. of the apparatus.

[Detailed Evaluation Results and Physical Properties of Crystal Growth Layer]

Evaluation results, physical properties and the like of the crystal growth layers in the first to third embodiments of the invention and Comparative Examples-1 to 3 will now be described hereinafter in detail with reference to the drawings. It is to be noted that FIG. 11 shows a list of growth conditions, evaluation results and physical properties of the respective crystal growth layers according to the embodiments and the comparative examples. Further, as shown in FIG. 11, in the following description, the crystal growth layers according to the first to third embodiments of the Invention are also simply referred to as EMB1, EMB2 and EMB3 and the crystal growth layers according to Comparative Examples-1 to 3 are also simply referred to as CMP1, CMP2 and CMP3, respectively, for brevity of description and better understanding. The crystal growth layers were evaluated and analyzed based on the following method.

A surface morphology was evaluated by using a differential polarizing microscope, an SEM (Scanning Electron Microscope) and an AFM (Atomic Force Microscope). Crystal orientation and flatness were evaluated using RHEED (reflection high-energy electron diffraction). Furthermore, crystal orientation and a defect/dislocation density were evaluated by using an X-ray diffractometer (XRD). An impurity concentration in the crystal was evaluated using secondary Ion mass spectrometry (SIMS).

It is to be noted that, in the XRD analysis, since the ZnO-based crystal layer was grown on a c-plane ZnO single crystal substrate 10 in each of the embodiments and the comparative examples, 2θ measurement and ω (rocking curve) measurement using the XRD were performed, a c-axis length was evaluated by using (002)2θ, and crystal orientation (or a degree of tilting or twisting) was evaluated by using a full width at half maximum (FWHM) of (002)ω or (100)ω. However, in case of a thin film of approximately 1 μm or below, a (002)ω measurement value cannot be accurately evaluated since an X-ray diffraction intensity of the substrate is large and an X-ray diffraction intensity of the growth layer is small. On the other hand, with regard to (100)ω measurement, a high-sensitivity evaluation of the crystal orientation can be performed with incidence/diffraction angle of 89° with reference to the c axis even if the crystal film is thin (approximately 30 nm). Therefore, in the XRD evaluation of the ZnO-based crystal layer, an FWHM value of (100)ω was determined as an index or measure.

It is to be noted that the crystallinity or crystal quality of the ZnO single crystal substrate manufactured by the hydrothermal method used in the present invention was excellent, and full widths at half maximum of (002)ω and (100)ω of the substrate having the etched surface were approximately 27 arcsec and 29 arcsec, respectively. Empirically, if each of the full widths at half maximum is 35 arcsec or less than 35 arcsec, the ZnO single crystal substrate can be preferably used as the substrate for a semiconductor light emitting element according to the present invention.

1. Growth Layer According to First Embodiment: EMB1

The first embodiment of the invention is an example in which the ZnO single crystal layer 11A (EMB1, see FIG. 11) was directly grown on the ZnO substrate without forming a buffer layer. That is, the ZnO single crystal layer in the thermostable state was directly grown on the ZnO substrate at the growth temperature Tg=800° C. Further, the nitrogen ($N_2$)

gas of the JIS grade-1 having the residual $O_2$ concentration of 5 ppm or below was used as the carrier gas.

In general, as a growth process when growing a thin film on a crystal substrate, the following growth modes are known (e.g., "Handbook of Crystal Growth", Japanese Association for Crystal Growth, 1995).

(a) A Frank-van der Merwe Mode

This is a layer-by-layer growth mode. More specifically, this is a mode that two-dimensional nuclei are first formed on the substrate and they gradually grow along a plane and are combined into one to effect growth in a layer-by-layer fashion.

(b) A Volmer-Weber Mode

This is a growth mode that three-dimensional island or cluster growth occurs from an initial stage of formation of an epitaxial layer. More specifically, three-dimensional islands or clusters are first formed on a substrate, they gradually grow to be combined into one, and then a continuous film is formed.

(c) A Stranski-Krastanow Mode

This is a mode that two-dimensional growth occurs on an initial stage of growth like the Frank-van der Merwe mode and then three-dimensional islands are formed thereon to grow like the Volmer-Weber mode.

(Flatness)

Figure 12:
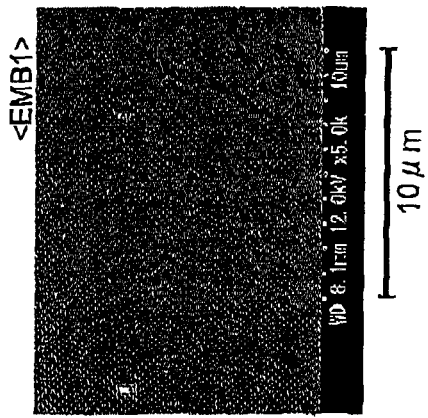
FIG. 12 shows an SEM image of a surface of a ZnO growth layer (EMB1) according to the first embodiment of the invention.
Figure 13:
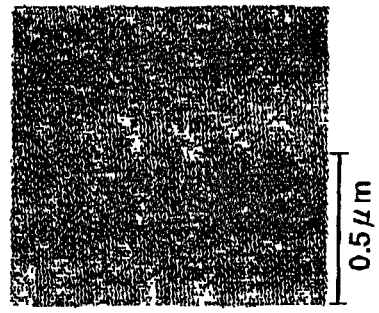
FIG. 13 shows an AFM image of the surface of the ZnO growth layer according to the first embodiment of the invention.

The surface of the ZnO growth layer 11A (EMB1) according to the first embodiment of the invention was a mirror plane. Further, a surface state was observed in detail by using the differential polarizing microscope, the SEM and the AFM. FIG. 12 shows an SEM image of the growth layer surface, and it was confirmed that the surface has a flat and excellent surface morphology. Furthermore, FIG. 13 shows an AFM image of the growth layer surface, and flatness was excellent since surface RMS roughness (or Rq, root mean square roughness)=0.18 nm was obtained in 1 $\mu m^2$ in an observation area of the AFM. Moreover, in AFM observation, steps and terraces were observed on the growth layer surface. That is, it was appreciated that the growth mode was a two-dimensional crystal growth process in which growth occurs in layer-by-layer fashion. The ZnO single crystal grown with the c plane as a main plane (or a growth plane) may undergo step-flow growth in bilayers, and it is considered that step bunching may occur depending on growth conditions. It was confirmed from these observation results that high flatness was provided from a wide region to a small region (macroscopically and microscopically).

(Crystal Orientation)

Figure 14:
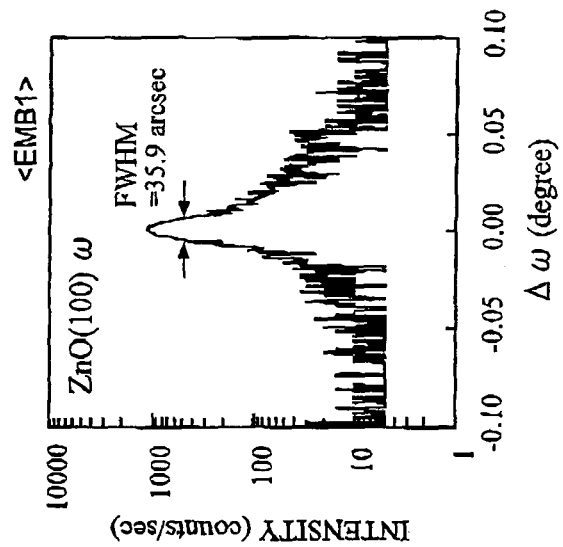
FIG. 14 is a view showing a rocking curve of XRD (100)ω of the ZnO growth layer (EMB1) according to the first embodiment.

With regard to the crystal orientation with respect to the substrate, a single peak was observed at 34.42° in (002)2θ measurement of the XRD. Further, as shown in FIG. 14 and FIG. 11, it was confirmed that a full width at half maximum (FWHM) of the rocking curve of (100)ω is as narrow as 35.9 arcsec and the crystal orientation of the ZnO single crystal substrate is excellent.

(Defect/Dislocation Density, Impurity Diffusion)

Figure 15:
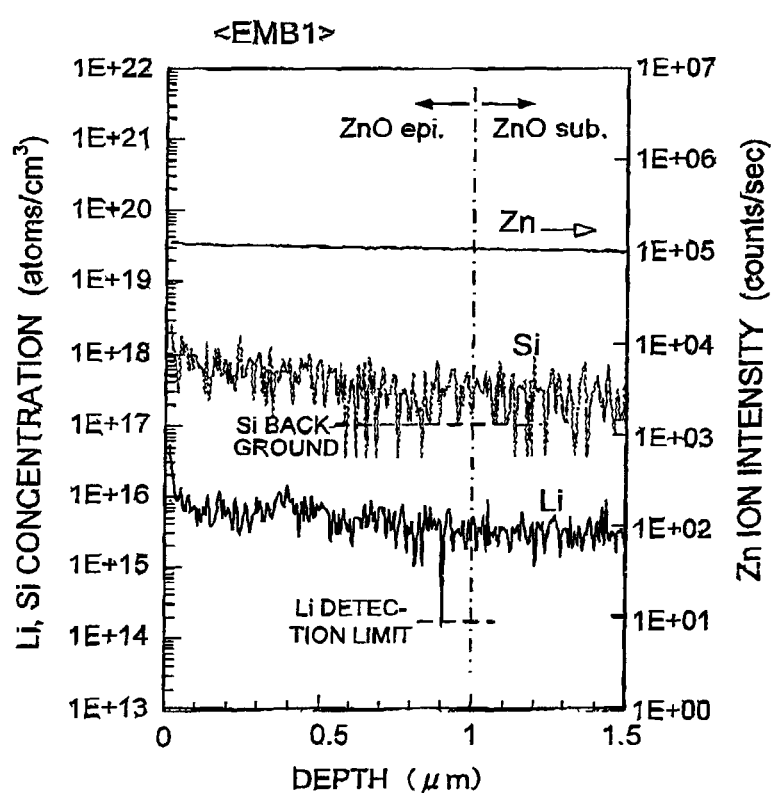
FIG. 15 shows an impurity concentration profile which is an SIMS measurement result in a depth direction of the ZnO growth layer (EMB1) according to the first embodiment of the invention.

FIG. 15 shows an SIMS measurement result of the ZnO growth layer (EMB1), which shows profiles of Li and Si concentrations in a depth direction. Here, attention should be particularly paid to the fact that Li or Si as an impurity derived from the substrate (or substrate-derived impurity) is not accumulated (or piled up) in the interface region (or in the proximity of the interface of the growth layer) between the ZnO substrate 10 and the ZnO single-crystal layer 11 (i.e., a ZnO epitaxial layer or "ZnO epi") at all.

It was recognized from the above-described evaluation results that the ZnO single crystal layer (EMB1) provided by the high-temperature growth according to the first embodiment of the invention is a single-crystal layer grown based on the Frank-van der Merwe mode and also a single-crystal layer in a thermostable state, which is a ZnO single crystal layer that has excellent flatness and crystal orientation, no accumulation of an impurity in an interface, a low defect/dislocation density and high integrity.

The crystal of the "thermostable state" herein means a crystal whose chemical-bonding state is stable. More specifically, it can be defined as a crystal, which has been grown in the Frank-van der Merwe mode, a "single crystal" in light of crystal engineering, and a crystal in a "thermal equilibrium state" in light of thermodynamics.

For example, a chemical-bonding state of the ZnO crystal grown at a high temperature (800° C.) according to the first embodiment is a thermo-stable state (or a ground state). Therefore, a crystal state does not readily vary due to a heat treatment.

On the other hand, a later-described crystal in a "quasi-thermostable state" means a crystal whose chemical-bonding state is unstable. In more detail, it can be defined as a crystal, which grows in the Stranski-Krastanow growth mode or a similar mode and is a "single crystal" in light of crystal engineering and a crystal in a "quasi-thermal equilibrium state" in light of thermodynamics. It is to be noted that the state of a thin-film single crystal layer, which is precisely a non-thermal equilibrium state but not the most stable state is defined as a quasi-thermal equilibrium state so as to be strictly distinguished from a polycrystal thin film state. For example, the ZnO buffer layer grown at a low temperature (e.g., 400° C.) is in the quasi-thermal equilibrium state, and its chemical-bonding state is not yet changed to a thermochemically stable state (i.e., a thermostable state). Therefore, due to a heat treatment at a high temperature (e.g., 900° C.), its crystal state considerably changes to a step-and-terrace-like shape of which surface energy becomes minimum are provided. In other words, the crystal state changes to the thermostable state.

Additionally, it is to be noted that a crystal in a "non-thermostable state" can be defined as "amorphous" or a "polycrystal" in terms of crystal engineering or a crystal in the "non-thermal equilibrium state" in terms of thermodynamics. For example, a ZnO amorphous or polycrystal buffer layer grown at a low temperature (e.g., 400° C.) is in the "non-thermal equilibrium state". Therefore, a crystal bonding state and a surface state considerably change due to a heat treatment at a high temperature (e.g., 900° C.). However, since a start state is an amorphous or polycrystal state, the non-thermostable state crystal cannot be changed to a single crystal having high integrity and a step-and-terrace surface state. In other words, transition to the "thermostable state" is impossible.

As described above, according to the growth method of the embodiment in which the ZnO single crystal of the thermo-stable state is directly grown on the ZnO substrate, the stacked or layered structure, which is superior in flatness and crystal orientation and has no an impurity accumulated in the interface, a low defect/dislocation density and high integrity can be formed without using the buffer layer (for example, the later-described Comparative Example-1) that is a growth layer of the quasi-thermostable state.

2. Growth Layer According to Second Embodiment: EMB2

Although the second embodiment of the invention uses the same manufacturing method as that in the first embodiment of the invention, it is different from the first embodiment of the invention in that a nitrogen ($N_2$) gas having a residual $O_2$ concentration that is less than 0.1 ppm (i.e., the residual O$_2$ concentration<0.1 ppm) is used as a carrier gas.

(Flatness, Crystal Orientation)

Figure 17:
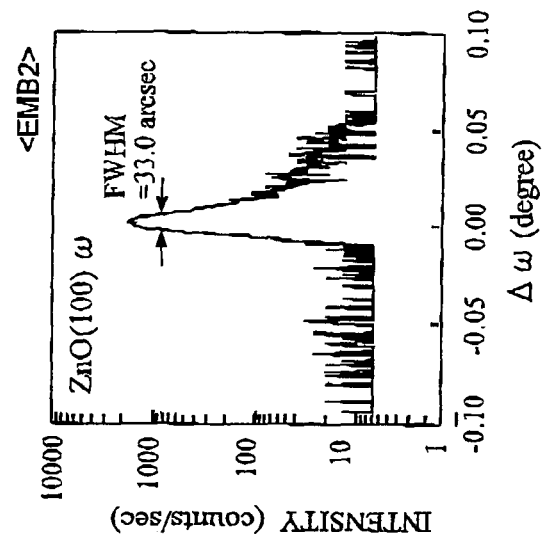
FIG. 17 is a view showing a rocking curve of XRD (100)ω of the ZnO growth layer (EMB2) according to the second embodiment of the invention.
Figure 16:
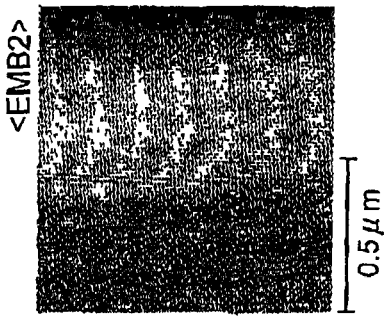
FIG. 16 shows an AFM image of a surface of a ZnO growth layer (EMB2) according to the second embodiment of the invention.

It was confirmed that the ZnO single crystal layer 11B (EMB2) according to the embodiment has a flat and excellent surface morphology based on the SEM evaluation like the first embodiment of the invention. Further, FIG. 16 shows an AFM Image of the growth layer surface, and the flatness was excellent since surface roughness RMS (root mean square roughness)=0.31 nm was obtained in 1 μm$^2$ in an AFM observation area. Furthermore, as shown in FIG. 17, it was confirmed that an FWHM of a rocking curve of (100)ω is as narrow as 33.0 arcsec and the crystal orientation with respect to the ZnO single crystal substrate is excellent.

(Defect/Dislocation Density, Impurity Diffusion)

Figure 18:
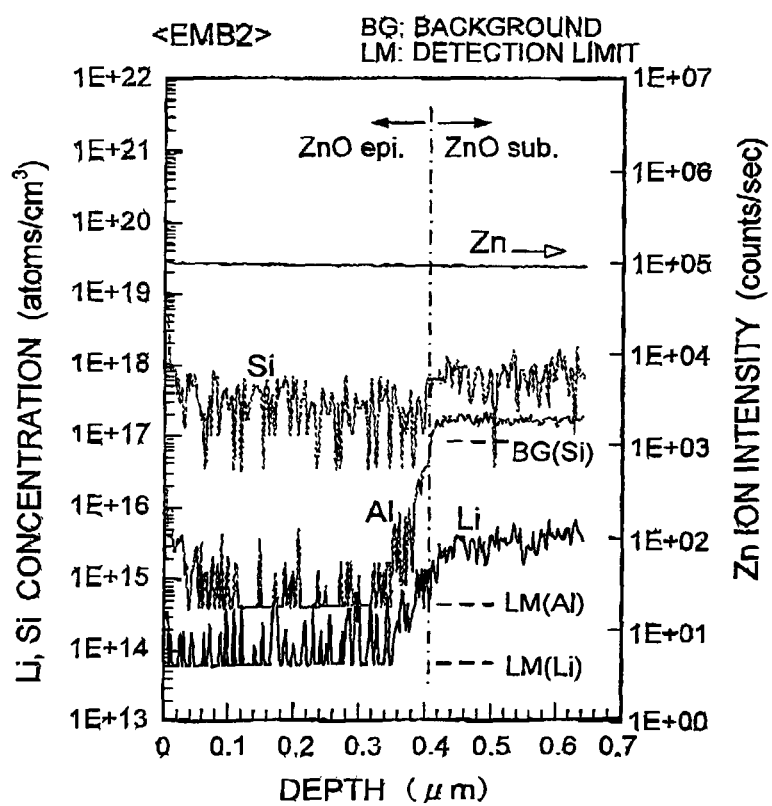
FIG. 18 shows an SIMS measurement result in a depth direction of the ZnO growth layer (EMB2) according to the second embodiment of the invention.

FIG. 18 shows an SIMS measurement result of the ZnO growth layer (EMB2) in the depth direction that is a profile of each of Li and Si concentrations in the depth direction. Like the first embodiment of the present invention, accumulation (pileup) of Li, Si and Al as impurities derived from the substrate (i.e., impurities contained in the substrate) is not observed in an interface region between the ZnO substrate 10 and the ZnO single crystal layer 11B (i.e., the ZnO growth layer). Moreover, such impurities are less than a detection lower limit (LM) even in the ZnO growth layer EMB2 (a layer thickness: 60 nm to 70 nm). It is to be noted that Impurities may look to diffuse from the substrate to the growth layer side for approximately several tens nanometers in the SIMS data. However, in SIMS data (FIG. 21) of the later-explained third embodiment of the present invention, taking a profile of Mg into consideration, it can be understood that a resolution of the SIMS measurement in the depth direction is approximately several-ten nm. Therefore, it cannot be said that the impurities are diffusing.

Like the first embodiment of the invention, the ZnO single crystal grown by the high-temperature growth according to the second embodiment of the invention is a thermostable crystal whose crystal state does not readily change due to a heat treatment. In other words, it is a crystal grown in the Frank-van der Merwe mode, which is a "single crystal" in terms of crystal engineering and a crystal in a "thermal equilibrium state" in terms of thermodynamics.

As described above, according to the method using the high-purity nitrogen (N$_2$) gas (the residual O$_2$ concentration <0.1 ppm) as a carrier gas (an atmospheric gas), it was recognized that the ZnO single crystal layer, which has the excellent flatness and crystal orientation, no accumulation of the impurity in the interface and no diffusion of the impurity into the growth layer, a low defect/dislocation density and high integrity can be grown.

3. Growth Layer According to Third Embodiment: EMB3

According to the third embodiment of the invention, the first ZnO-based crystal layer (ZnO) 11C was grown by using the same manufacturing method as that in the second embodiment of the invention, and a second ZnO-based crystal (MgZnO) layer 12 (EMB3) was grown on the crystal layer under the conditions of a low pressure and low water vapor flow rate (FIG. 6). It is to be noted that a nitrogen (N$_2$) gas whose residual O$_2$ concentration is less than 1 ppb was used as a carrier gas.

(Flatness, Crystal Orientation)

Figure 20:
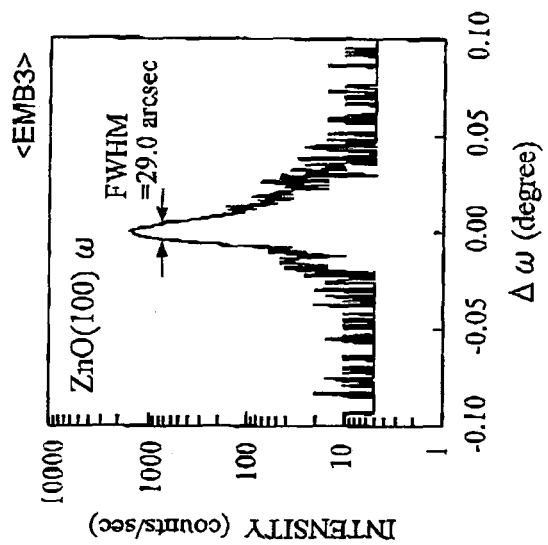
FIG. 20 is a view showing a rocking curve of XRD (100)ω of the ZnO growth layer (EMB3) according to the third embodiment of the invention.
Figure 19:
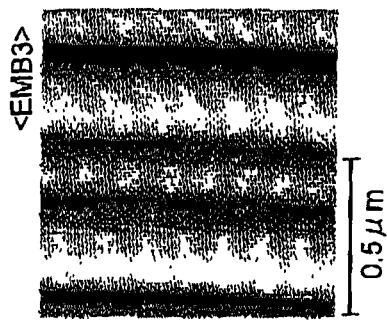
FIG. 19 shows an AFM image of a surface of a ZnO growth layer (EMB3) according to the third embodiment of the invention.

It was confirmed that the Mg$_x$Zn$_{(1-x)}$O(x=0.40) single crystal layer 12 (EMB3) has a flat and excellent surface morphology by the SEM evaluation like the first and second embodiments of the invention. Additionally, FIG. 19 shows an AFN image of the growth layer surface, and flatness was excellent since surface roughness RMS=0.56 nm was obtained in 1 μm$^2$ in an observation area of the AFM. It is to be noted that, since the second ZnO-based crystal layer 12 is the Mg$_x$Zn$_{(1-x)}$O layer, step bunching occurs, but crystallinity is not degraded. Further, as shown in FIG. 20, it was confirmed that an FWHM of the rocking curve of (100)ω is as narrow as 29.0 arcsec and the crystal orientation with respect to the ZnO single crystal substrate is excellent.

(Defect/Dislocation Density, Impurity Diffusion)

Figure 21:
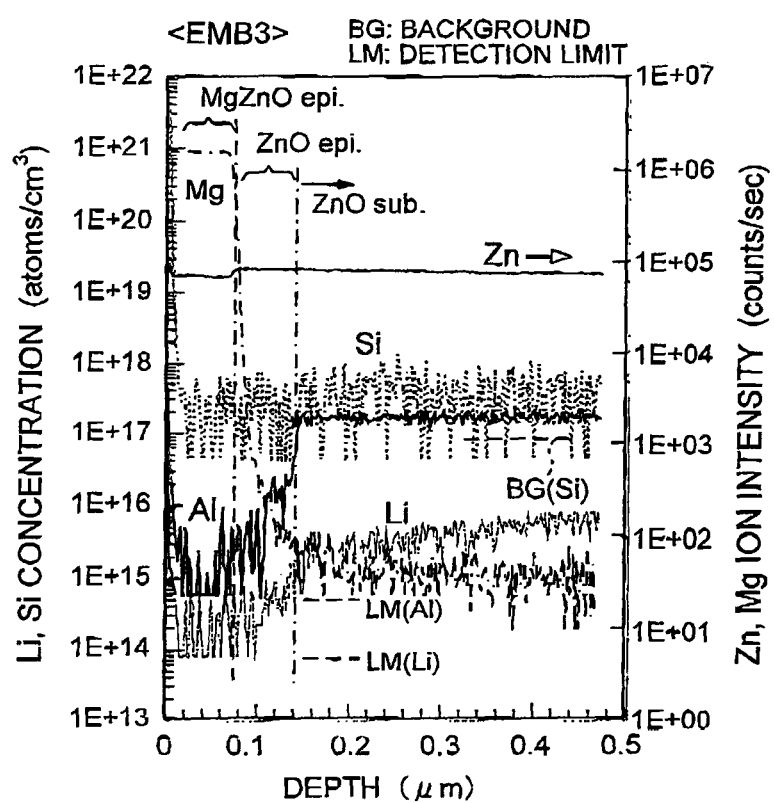
FIG. 21 shows an SIMS measurement result in a depth direction of the ZnO growth layer (EMB3) according to the third embodiment of the invention.

FIG. 21 shows an SIMS measurement result of the first ZnO-based crystal layer (ZnO) 11C and the second ZnO-based crystal (MgZnO) layer 12 (EMB3), which is a profile of each of Li, Si, an Al concentrations in the depth direction.

Here, a noteworthy point is that accumulation (pileup) of impurities does not occur in the interface region like the first and second embodiments of the invention and impurities Li, Si, Al and the like are reduced to a detection lower limit (LM) or below in the ZnO layer (the first ZnO-based crystal layer 11C) which is the first layer. Furthermore, another noteworthy point is that impurities are also reduced to the detection lower limit or below in the Mg$_x$Zn$_{(1-x)}$O (x=0.4) layer which is the second layer.

Meanwhile, the MgZnO crystal has a longer a-axis length and shorter c-axis length than those of the ZnO crystal. Furthermore, a lattice constant difference from the ZnO crystal increases as a Mg composition becomes larger. The MgZnO layer according to the third embodiment of the invention is stacked in a coherent state in which the a-axis length is matched with that of the ZnO layer, and undergoes a large lattice distortion. It was found that the ZnO-based single crystal layer, which has no diffusion of impurities into the growth layer, a low defect/dislocation density and very high integrity can be grown even when growing a MgZnO layer undergoing large lattice distortion.

4. Growth Layers According to Comparative Examples-1 to 3: CMPs 1 to 3

4.1 Growth Layer According to Comparative Example-1 (CMP1)

The growth layer according to Comparative Example-1 is the ZnO single crystal layer 62 (CMP1) obtained by forming the single-crystal buffer layer (i.e., a low-temperature growth buffer layer) 61 in a quasi-thermostable state, performing crystallinity restoration with annealing at a high temperature (900° C.) to change the buffer layer 61 to the thermostable-state ZnO single crystal layer and performing growth on the buffer layer 61 at a high temperature (800° C.).

(Flatness)

Figure 22:
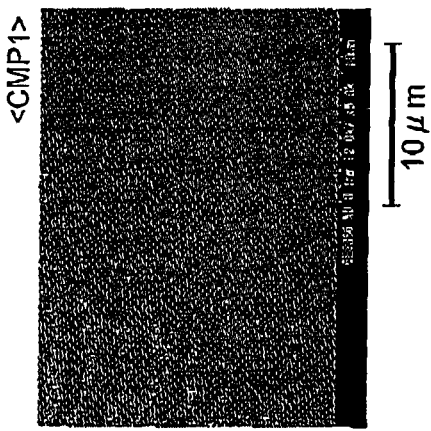
FIG. 22 shows an SEM image of a ZnO growth layer (CMP1) of Comparative Example-1.
Figure 23:
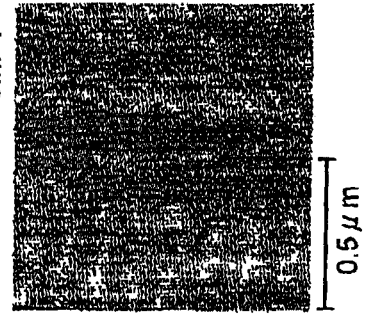
FIG. 23 shows an AFM image of the ZnO growth layer (CMP1) of Comparative Example-1.

FIG. 22 shows an SEM image of the ZnO growth layer 62 (CMP1) according to Comparative Example-1. A surface of the ZnO single crystal layer 62 (CMP1) is a mirror surface and has a flat and excellent surface morphology. Moreover, FIG. 23 shows an AFM image of the growth layer surface. The flatness was excellent since surface roughness RMS=0.12 nm was obtained in a 1 μm$^2$ observation area of the AFM. Based on these observation results, the high flatness was provided from a small region to a wide region.

(Crystal Orientation)

Figure 24:
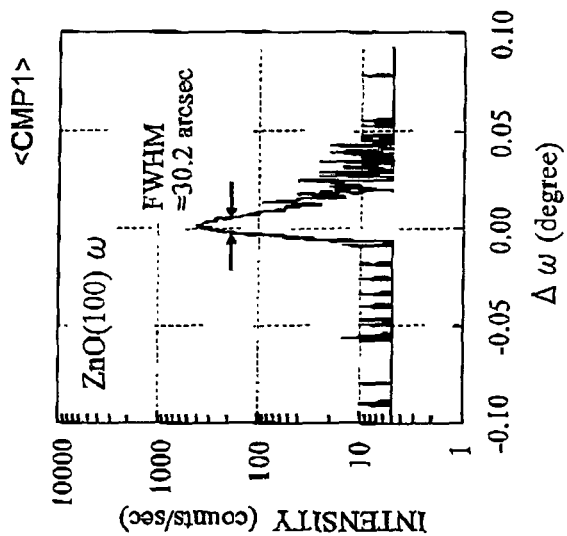
FIG. 24 is a view showing a rocking curve of XRD (100)ω of the ZnO growth layer (CMP1) of Comparative Example-1.

With regard to the crystal orientation with respect to the substrate, a single peak was observed at 34.42° in (002)2θ measurement of the XRD. Additionally, as shown in FIG. 24, it was confirmed that an FWHM of the (100)ω rocking curve was as narrow as 30.2 arcsec and the crystal orientation is excellent.

(Defect/Dislocation Density, Impurity Diffusion)

Figure 25:
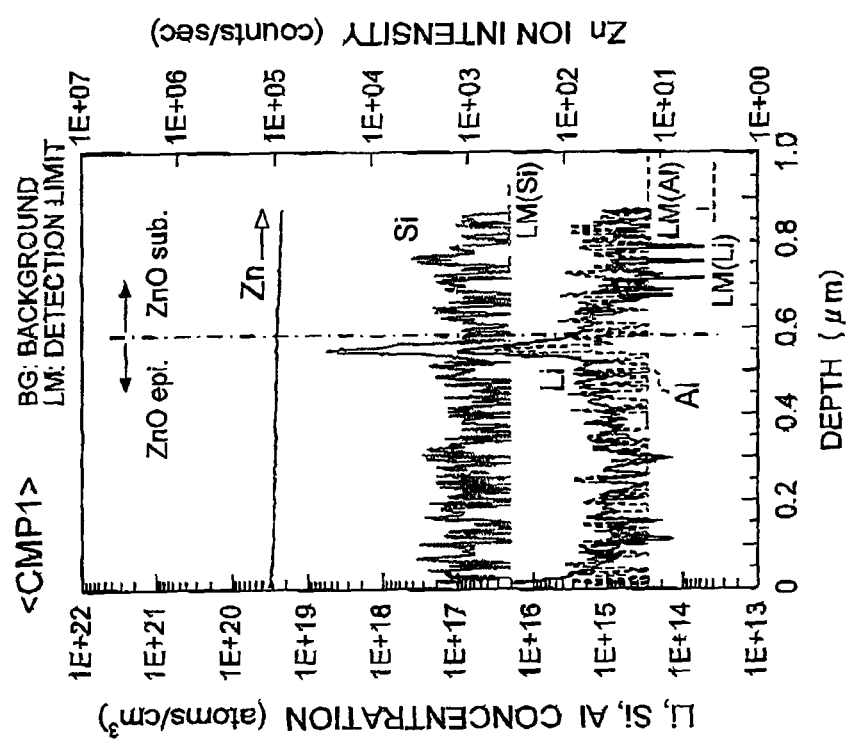
FIG. 25 shows an SIMS measurement result in a depth direction of the ZnO growth layer (CMP1) of Comparative Example-1.

FIG. 25 shows an SIMS measurement result of the ZnO growth layer (CMP1) in the depth direction, which is a profile of each of Li, Si and Al concentrations in the depth direction. As different from the first to third embodiments of the invention, accumulation (pileup) of Li, Si and Al impurities derived from the substrate was observed in the interface region (i.e., in the ZnO growth layer 61 in the proximity of the interface) between the ZnO substrate 10 and the ZnO growth layer (i.e., the buffer layer) 61. Further, as shown in FIG. 25, these impurities were also detected in the ZnO growth layer 62, and it was recognized that the impurities diffuse into the ZnO growth layer 62.

As described above, the growth method according to Comparative Example-1 has problems, i.e., the pileup of impurities in the substrate interface and the diffusion of impurities into the ZnO growth layer even though the ZnO crystal layer having the excellent flatness and crystal orientation can be grown. In other words, in the ZnO crystal obtained by the growth method using the technology for forming the buffer layer of the quasi-thermostable state, defect and dislocation densities cannot be reduced to a fixed level or below (i.e., a level that cannot be detected in the XRD), and the accumulation of the impurities in the substrate interface region and the diffusion of the impurities into the ZnO growth layer cannot be avoided.

The accumulation of substrate impurities in the interface and the diffusion of the impurities into the ZnO growth layer occur due to producing solid solution of the impurities or deposits of the substrate with the growth layer in a process in which the single-crystal buffer layer in the quasi-thermostable state formed on the ZnO single crystal substrate changes to the thermostable state by a heat treatment For example, a $Zn_{(1-x)}Li_xO$ crystal is produced if Li is present, a $Zn_{(1-x)}Si_xO$ crystal is produced if Si is present, a $Zn_{(1-x)}Al_xO$ crystal is produced if Al is present, a $Zn_{(1-x)}Ga_xO$ crystal is produced if Ga is present, and a $Zn_{(1-x)}In_xO$ crystal is produced if In is present (i.e., production of denatured crystals). As described above, since impurities are solved in the buffer layer by a heat treatment, there is a problem that crystallinity cannot be sufficiently restored. Additionally, such a phenomenon may occur in not only the growth performed by the MOCVD method but also the growths carried out by an MBE method and a PLD method, and solving this problem is important. The accumulation of impurities and the diffusion of the impurities into the growth layer result in a problem that an electric resistance of a semiconductor device is increased and a forward voltage (Vf) is increased in the semiconductor device, for example.

4.2 Growth Layer According to Comparative Example-2 (CMP2)

The growth layer according to Comparative Example-2 (CMP2) is the ZnO crystal grown on the ZnO single crystal substrate by the same method as that in the second embodiment of the invention except that oxygen ($O_2$) was used as an oxygen source and a nitrogen ($N_2$) gas whose residual $O_2$ concentration is less than 1 ppb was used as a carrier gas (see FIG. 11). It is to be noted that conditions suitable for the oxygen gas were used as growth conditions such as a growth temperature or a VI/II ratio.

(Flatness/Crystal Orientation)

Figure 26:
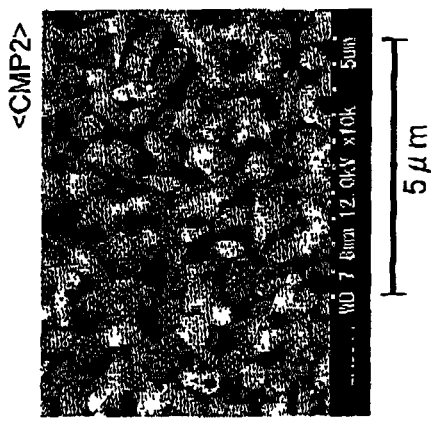
FIG. 26 shows an SEM image of a surface of a ZnO growth crystal (CMP2) of Comparative Example-2.

FIG. 26 shows an SEM image of the ZnO growth crystal (CMP2) according to Comparative Example-2. The crystal grown on the substrate was polycrystal having a hexagonal columnar shape, and it was poor in flatness and crystal orientation. It can be considered that such properties are provided because the oxygen gas ($O_2$) obstructs a two-dimensional crystal growth process but facilitates three-dimensional crystal growth. Therefore, the method according to Comparative Example-2 using the oxygen gas ($O_2$) is not suitable for manufacture of a semiconductor device such as a semiconductor light emitting device that requires a multi-layered structure.

4.3 Growth Layer According to Comparative Example-3 (CMP3)

The growth layer according to Comparative Example-3 (CMP3) is the ZnO crystal grown on the ZnO single crystal substrate by the same method as that in the second embodiment of the invention except that a nitrous oxide ($N_2O$) was used as an oxygen source and a nitrogen ($N_2$) gas whose residual $O_2$ concentration is less than 1 ppb was used as a carrier gas (see FIG. 11). It is to be noted that a VI/II ratio was adjusted to a value suitable for the $N_2O$ gas and a growth temperature was set to 1000° C. that is an upper limit temperature of the apparatus.

(Flatness/Crystal Orientation)

Figure 27:
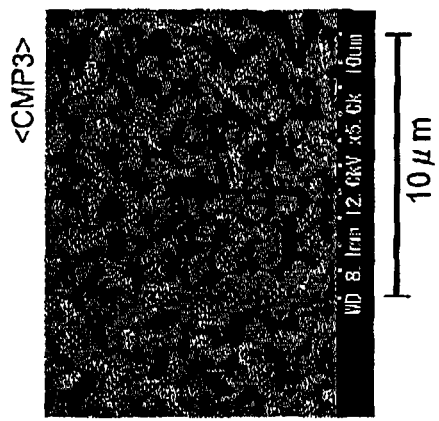
FIG. 27 shows an SEM image of a surface of a ZnO growth crystal (CMP3) of Comparative Example-3.

FIG. 27 shows an SEM image of a surface of the ZnO growth crystal (CMP3) according to Comparative Example-3. The ZnO growth crystal (CMP3) was polycrystal having both a plate-like (disc-like) shape and a wall-like (thin wall) shape.

Since the nitrous oxide ($N_2O$) is a stable gas, the growth temperature must be set to 900° C. or above to use this gas for crystal growth. An oxygen radical (O*) discharged by thermal decomposition mainly serves as the oxygen source. It can be considered that a single crystal having an excellent layer structure cannot be obtained because the oxygen radical obstructs the two-dimensional crystal growth process and facilitates the three-dimensional crystal growth like oxygen ($O_2$). Therefore, the method according to Comparative Example 3 using the nitrous oxide ($N_2O$) is not suitable for manufacture of a semiconductor device such as a semiconductor light emitting device that requires multi-layered structure.

[Factors of High-Quality Single Crystal Layer Growth]

As described in the first to third embodiments of the invention, according to the present invention, the ZnO-based single crystal layer that is superior in flatness and crystal orientation and has a low defect/dislocation density can be directly grown on the ZnO single crystal substrate. Factors that enable growth of such a high-quality single crystal layer and growth conditions were examined and studied in detail as follows.

Firstly, in a related art, a ZnO single crystal layer that is superior in flatness and crystal orientation and has a low defect/dislocation density cannot be grown on a ZnO single crystal substrate at a high temperature that the crystal enters the thermostable state. That is because a ZnO-based crystal having a hexagonal crystal structure has characteristics that a columnar crystal strongly oriented to a c-axis is apt to be grown and the growth advances in an abnormal growth mode when abnormal growth (i.e., non-two-dimensional growth) once starts. Further, an oxygen defect or deficiency is apt to occur and an impurity concentration increases in the high-temperature growth (not lower than 600° C., especially not lower than 700° C.). However, the thermostable crystal fundamentally has high chemical/physical crystal stability, and a technology for growing the thermostable crystal is necessary for manufacture of a layered crystal for a semiconductor device.

Additionally, although a growth technology using a buffer layer has been conventionally employed, a problem that impurities derived from the substrate are accumulated (piled up) in an interface region between the substrate in the growth technology using a buffer layer which is a quasi-thermostable growth layer and the substrate impurities diffuse into a ZnO-based crystal growth layer on the buffer layer has become apparent (e.g., Comparative Example-1).

Furthermore, according to the present invention, in order to grow the ZnO-based single crystal layer that is superior in flatness and crystal orientation and has a low defect/dislocation density on the ZnO-based single crystal substrate, the water vapor and the metalorganic material containing no oxygen in constituent molecules were used to perform crystal growth at a high temperature which allows the thermostable crystal to grow. Further, the ZnO-based single crystal layer that has no diffusion of impurities and has less defects/dislocation can be grown by excluding or reducing oxygen ($O_2$) gas from the growth ambient. Furthermore, the single-crystal layer that is superior in flatness and crystal orientation and has a low defect/dislocation density can be grown without an influence of a substrate damage can be grown by removing a substrate damage layer in accordance with a thickness of the damage layer (the XRD measurement) by etching. Functions, effects, growth conditions and the like of the growth method will now be described hereinafter in detail.

[Crystal Growth Material and Crystal Growth in Thermostable State]

It was recognized that a water vapor and a metalorganic material containing no oxygen in molecules must be utilized to perform growth at a high temperature in order to grow on a ZnO single crystal substrate a thermostable single crystal layer that is superior in flatness and crystal orientation and has a low defect/dislocation density.

As described above, $H_2O$ (water vapor) as an oxygen source is a polar oxidation gas having large polarization, and it has excellent oriented adsorption properties to an oxide crystal surface even at a high temperature and reacts with a metalorganic compound material on the surface. Moreover, the met alorganic material containing no oxygen atoms in constituent molecules has high reactivity with $H_2O$ (water vapor). To provide crystal growth with excellent flatness, a process that a chemical species concerning growth (e.g., water vapor, a metalorganic compound, or decomposed intermediates thereof) reacts with each other on a substrate surface is required as a first step, and a process that the chemical species concerning growth migrates and is placed at a stable site of the crystal to be crystallized is required as a second step (i.e., a two-dimensional crystal growth process). Therefore, $H_2O$ and the metalorganic compound containing no oxygen are a combination of excellent materials having both of the processes or functions. In other words, water vapor adsorbs onto the oxide crystal surface, and the metalorganic compound attacks the adsorbed water vapor and settles on the crystal stable site while performing reaction and migration. This action enables the crystal growth with excellent flatness. At the same time, the crystal growth with high crystal orientation to the substrate surface and a low defect/dislocation density can be provided.

Moreover, a single crystal layer of the thermostable state (hereinafter, also referred to as "high-temperature grown single crystal" or simply as "high-temperature (HT) single crystal"), i.e., a single crystal layer (in a thermal equilibrium state) that has been grown at a high temperature is crystallographically a perfect crystal or has thermodynamically the most stable step-and-terrace-like surface, and does not undergo a change in state due to a heat treatment after the growth. That is, since the high-temperature grown single crystal is a crystallographically perfect crystal and the surface state thereof is thermodynamically the most stable step-and-terrace-like surface, its state does not change due to a heat treatment. It is to be noted that a specific growth temperature of the high-temperature growth will be described later.

In the growth mode of the high-temperature grown single crystal layer, surface migration of the chemical species is sufficient because of the high-temperature growth, and the crystal growth advances in the two-dimensional crystal growth mode. More specifically, a crystal species couples with a kink point or a step end of the step-and-terrace-like surface to grow. Therefore, a defect or dislocation is hard to be introduced into the crystal, and a crystal having high integrity can be grown. Since the substrate impurities diffuse into the growth layer through a crystal defect/dislocation in the growth layer, the substrate impurities can be suppressed from diffusing into the growth layer where the growth layer is the thermostable (i.e., high-temperature grown) ZnO-based single crystal layer having low defect and dislocation densities.

On the other hand, a "low-temperature grown single crystal (also simply referred to as low-temperature (LT) single crystal)" (the buffer layer) that is a quasi-thermostable single crystal layer is crystallographically a perfect crystal, but the surface state thereof is not the most stable surface state (i.e., a quasi-thermal equilibrium state). Additionally, the low-temperature grown single crystal changes to have the most stable step-and-terrace-like surface due to a heat treatment. However, even though restoration of crystallinity is attempted by a heat treatment, there is a limit, and a defect or dislocation in the substrate is kept, whereby the crystal layer having high integrity is not formed on the buffer layer even in the growth using the buffer layer. For example, it can be understood that impurities derived from the substrate, e.g., Li, Si and Al diffuse in the high-temperature growth layer on the buffer layer because of such properties.

In other words, according to the buffer layer technology for performing crystal growth of the buffer layer at a low temperature and restoring crystallinity of the buffer layer by a heat treatment, it was recognized that there is a limit in growing the single crystal layer that has excellent flatness and crystal orientation, a low defect/dislocation density and high integrity. Additionally, it was found that the buffer layer technology has a problem that the substrate impurities are accumulated in the interface region between the ZnO substrate and the ZnO growth layer and a problem that the substrate impurities diffuse into the growth layer. Further, these problems are solved by the method according to the present invention for directly growing the thermostable-state ZnO-based single crystal on the ZnO single crystal substrate without forming the buffer layer.

[Growth Atmosphere and Defect/Dislocation Density]

It was discovered from the detailed evaluation results of the growth layer that exclusion of the oxygen ($O_2$) gas as nonpolar oxidation gas from the growth atmosphere is important for growing a ZnO-based single crystal layer with a low defect/dislocation density and free from impurity diffusion.

As apparent from the results according to Comparative Example-2 and Comparative Example-3, when $O_2$ or $N_2O$ is used as an oxygen source, growth is effected in a three-dimensional crystal growth process to provide a needle-like (or whisker), a columnar (or rod-like) or plate-like (or disc-like) crystal. This is because an $O_2$ or $N_2O$ molecule has a linear molecular configuration and is hard to be affected by a surface atom arrangement of the ZnO crystal, and hence a ZnO crystal is generated at an unspecified position on the crystal surface. Therefore, both two-dimensional and three-dimensional crystal growth processes takes place, and a defect (e.g., oxygen defect or deficiency) or dislocation density increases.

That is, in the crystal growth process, the $O_2$ gas or the $N_2O$ gas obstructs the two-dimensional crystal growth process and facilitates the three-dimensional crystal growth process, and hence it degrades flatness and crystal orientation of the ZnO-based crystal layer. Therefore, even in the growth method using the water vapor and water vapor and the metalorganic compound (e.g., DMZn) is adopted, if a small amount of oxygen is present in the growth atmosphere, defects and/or dislocation are introduced into the ZnO single crystal with a density in accordance with an oxygen concentration in the growth atmosphere, although defects or dislocation cannot identified in the XRD analysis.

In the ZnO single crystal substrate obtained by the hydrothermal method adopted in the embodiment, Li (lithium) may include a relatively high concentration due to its manufacturing method. Further, Al (aluminum) is added at a necessary concentration for control of a conductivity type of the substrate. On the other hand, defects (a Zn defect, an oxygen defect, a composite defect) or dislocation (edge dislocation, spiral dislocation) in the growth layer facilitate impurity diffusion in the substrate crystal. Therefore, impurities derived from the substrate, e.g., Li or Al diffuse into the ZnO growth layer. Of course, it likewise occurs in a ZnO single crystal substrate from an ingot manufactured by a method other than the hydrothermal method. When the substrate impurities diffuse into the ZnO growth layer in this manner, a problem occurs since electrical characteristics or optical characteristics are decreased in manufacture of a semiconductor light emitting device and the like. For example, there occurs problems that control of a conductivity type, e.g., p-type control is difficult, Vf (a forward voltage) is increased, Vr (a reverse voltage) is decreased, and a light-emission efficiency is decreased.

As described above, when a residual oxygen concentration in the nitrogen gas (or the carrier gas) that flows into the reaction chamber was reduced to 0.1 ppm or below and crystal growth was performed in the growth atmosphere where the oxygen concentration (the $O_2$ concentration) was 0.1 ppm or below, a ZnO-based crystal layer that had high flatness and crystal orientation and a low defect/dislocation density was obtained. As a result, the diffusion of the substrate impurities can be sufficiently suppressed (e.g., the second and third embodiments), and the high-quality ZnO-based crystal layered structure can be formed. That is, the diffusion of the impurities from the substrate into the ZnO-based crystal growth layer via defects/dislocation means that the impurities utilized as dopants diffuse into an adjacent crystal layer from the ZnO-based crystal growth layer when the ZnO-based crystal growth layer is doped with the impurities. Furthermore, since defects/dislocation may increase or grow during an operation of a semiconductor device such as a semiconductor light emitting device, the impurity diffusion becomes a more serious problem. According to the present invention, since a low defect/dislocation density can be provided and the diffusion of the impurities can be suppressed even in formation of the crystal layered structure, the invention is suitable for manufacture of a high-performance semiconductor device.

Figure 28:
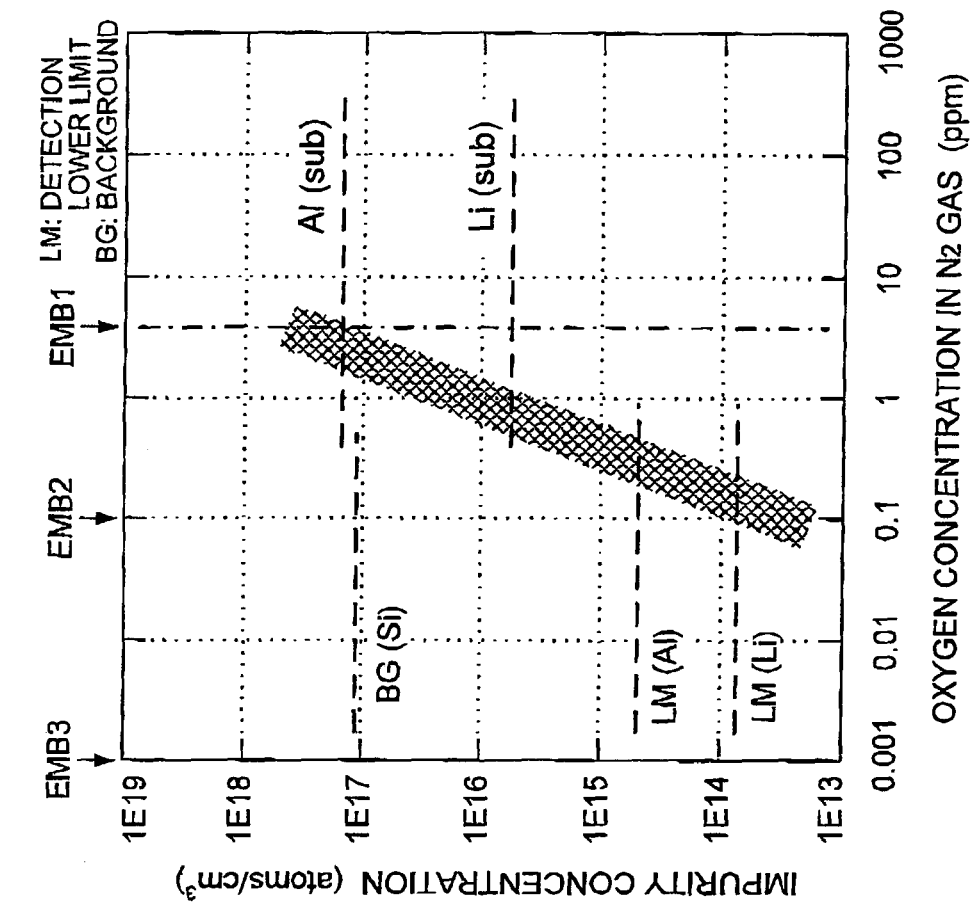
FIG. 28 is a view showing a relationship between a residual oxygen concentration in a carrier gas and an impurity concentration diffusing in the growth layer.

FIG. 28 shows a relationship between a residual oxygen concentration in the carrier gas and a concentration of each in-substrate impurity (or impurity contained in the substrate) that diffuses into the growth layer. The diffusion of the in-substrate impurities into the growth layer was evaluated based on the SIMS. In an experiment, ultrahigh-purity $N_2$ (a residual $O_2$ concentration is less than 1 ppm) and a mixed gas that contains the ultrahigh-purity $N_2$ as a base gas and has an $O_2$ concentration of 100 ppm were used, growth was performed while changing the residual $O_2$ concentration in the carrier gas, and a relationship between the $O_2$ concentration and a concentration of each impurity diffused in the growth layer was evaluated.

It is to be noted that, in the drawing, concentrations (Al (sub), Li(sub)) of the in-substrate impurities (Al and Li), detection lower limits of Al and Li, a background of Si are indicated by broken lines. Further, hatched region or range represents a diffused impurity concentration in the growth layer with respect to the residual $O_2$ concentration. That is, even if the $O_2$ concentration in the growth atmosphere is unchanged, a diffusion extent varies depending on a defect, a dislocation type and an impurity type, and hence a concentration of each impurity that diffuses in the growth layer has a certain range. Furthermore, in the drawing, 1En is an exponential notation. For example, 1E17 means $1 \times 10^{17}$.

Since defects/dislocation in the growth layer facilitates the impurity diffusion in the substrate crystal, a concentration of each impurity that diffuses in the growth layer is dependent on a defect/dislocation density in the growth layer. In other words, an impurity concentration due to the diffusion increases as a defect/dislocation density in the growth layer increases.

As shown in FIG. 28, it was recognized that, when the carrier gas having the residual $O_2$ concentration of 5 ppm is used to perform growth (in the growth atmosphere), the impurities having concentrations equal to those in the substrate diffuse into the growth layer. It can be considered that the diffusion occurs since a concentration of an impurity that diffuses into the growth layer grown in the atmosphere having this $O_2$ concentration exceeds the in-substrate impurity concentration.

It is to be noted that, as described above, accumulation (pileup) of the substrate impurities does not occur in the interface between the ZnO substrate 10 and the ZnO single crystal layer 11 in the growth layer formed in the growth atmosphere having the $O_2$ concentration of 5 ppm (the first embodiment, FIG. 15). Therefore, when the invention is applied to a semiconductor device, a problem, e.g., an increase in electrical resistance due to the accumulation of the substrate impurities or an increase in the forward voltage (Vf) can be avoided.

Further, when the growth was performed in the growth atmosphere having an $O_2$ concentration of 1 ppm or below, the impurity concentration in the growth layer was lower than the substrate impurity concentration (e.g., the second embodiment). Additionally, when the growth was performed in the growth atmosphere having an $O_2$ concentration of 0.1 ppm or below, an impurity concentration fell below the detection lower limit for an impurity concentration, and measuring the impurity concentration in the growth layer was impossible. More specifically, a concentration of an impurity derived from the substrate is $1 \times 10^{15}$ cm$^{-3}$ or below when the in-substrate impurity is aluminum (Al), and a concentration of the impurity derived from the substrate is $1 \times 10^{14}$ cm$^{-3}$ or below when the in-substrate impurity is lithium (Li).

That is, the diffusion of each impurity (Li, Si, Al) contained in the substrate into the ZnO growth layer was successfully suppressed with 1 ppm as the $O_2$ concentration in the growth atmosphere being determined as a border. Further, as shown in FIG. 28, when the $O_2$ concentration in the growth atmosphere was set to be less than 0.1 ppm, the diffusion of each substrate impurity into the ZnO growth layer was successfully suppressed to the detection lower limit or below even though the substrate whose impurity concentration exceeds $1 \times 10^{17}$ cm$^{-3}$ was used.

In other words, growing the thermostable single crystal layer in an atmosphere obtained by excluding the oxygen gas (the nonpolar oxidation gas) from the growth atmosphere is important for suppressing the diffusion of the substrate impurities into the growth layer. This atmosphere will be referred to as an oxygen-gas-excluded atmosphere (or a nonpolar oxidation-gas-excluded atmosphere, in a broad sense) hereinafter. Furthermore, as described above, it is preferable for the oxygen-gas-excluded atmosphere to be an atmosphere in which an oxygen gas concentration is not greater than 1 ppm. In particular, since the impurity diffusion and a defect/dislocation density in the growth layer can be greatly reduced by performing the growth in the atmosphere in which the oxygen gas concentration is less than 0.1 ppm, this atmosphere is more preferable in light of control of a later-described conduction type (a p-type) and an operation of a semiconductor device, especially an operation of a semiconductor light emitting device, which operates at a high current density.

Moreover, a reduction in defect/dislocation density in the ZnO-based crystal layer resulted in a decrease in a residual carrier density. In the ZnO crystal growth layer, a donor concentration Nd was not greater than $6 \times 10^{15}$ cm$^{-3}$ (CV measurement). Additionally, in the MgZnO crystal growth layer, a high resistance (i.e., p- or n-type determination was impossible) was obtained.

It is to be noted that the $O_2$ concentration in the growth atmosphere can be defined by an oxygen molecular flow rate (SF) that flows in per unit substrate area as follows. That is, since an effective ejection diameter of the shower head 30 used in the embodiments is $\phi 75$ mm, an effective ejection area is 44.16 cm$^2$. Meanwhile, a molar flow rate $F_{O2}$ when the residual $O_2$ concentration in the carrier gas (i.e., the nitrogen gas) is $F_{O2}=(4/22.4) \times (1 \times 10^{-6})=0.17$ µmol/min.

Accordingly, an inflow molar flow rate $SF_{O2}$ of residual oxygen per unit substrate area is $SF_{O2}=0.17$ (µmol/min)/$44.16=3.85 \times 10^{-3}$ µmol/(min·cm$^2$)). That is, if the inflow molar flow rate $SF_{O2}$ of residual oxygen per unit substrate area is $3.85 \times 10^{-3}$ µmol/(min·cm$^2$) or below (corresponding to the $O_2$ concentration in the growth atmosphere that is 1 ppm or below) the diffusion of the impurities contained in the substrate into the ZnO growth layer can be sufficiently suppressed. Further, like the above description, it is more preferable for $SF_{O2}$ to be less than $3.85 \times 10^{-4}$ µmol/(min·cm$^2$) (corresponding to the $O_2$ concentration that is less than 0.1 ppm).

As described above, the manufacturing method according to the present invention has excellent effects, e.g., (i) a defect/dislocation density is reduced and accumulation of substrate Impurities and diffusion of the impurities into the ZnO-based crystal layer are suppressed, (ii) diffusion of impurities from the doped ZnO-based crystal layer to the other crystal layer is suppressed, and (iii) an increase in defects and dislocation is suppressed in addition to the effect that the single crystal layer superior in flatness and crystal orientation can be grown. Therefore, when applying the invention to a semiconductor device and the like, impurity concentration control (a carrier density), impurity concentration profile control, and abrupt interface control can be carried out, an n-type ZnO-based crystal layer, a light-emission layer, a p-type ZnO-based crystal layer and a multi-layered structure each having excellent characteristics can be formed, thereby enabling manufacture of a ZnO-based crystal layer semiconductor light emitting device having excellent electrical characteristics and high-performance, for example, a high light-emission efficiency.

In particular, one of the most important problems when realizing the ZnO-based semiconductor device lies in that a p-type crystal having excellent conductivity could not be obtained. That is, a main reason that the p-type crystal having excellent conductivity could not be obtained is that a residual carrier (i.e., an electron) of a negative charge produced due to oxygen vacancy or a carrier (an electron) of a negative charge derived from a defect or dislocation compensates positive charge carriers (i.e., holes) produced from a p-type impurity. Therefore, according to the present invention that enables growth of the ZnO-based crystal having a low defect and dislocation density and high integrity, a semiconductor light emitting device having excellent electrical characteristics and optical characteristics can be manufactured.

[Removal of Surface Damage Layer on Substrate]

To grow a thermostable-state ZnO-based crystal layer having excellent flatness and crystal orientation and a low defect/dislocation density on a ZnO single crystal layer, removing a damage layer of a small thickness and deposits on the ZnO substrate surface is important.

That is, although the damage layer is a thin surface layer portion, it assuredly obstructs growth (two-dimensional growth process) of the thermostable-state ZnO-based crystal and degrades flatness of a growth layer. This layer acts to obstruct migration of a chemical species (e.g., water vapor, a metalorganic compound or decomposed intermediates thereof) concerning the growth and induce crystallization at a position other than a crystal stable site of each atom. Furthermore, there is a problem of introduction of defects or dislocation.

The thickness of the damage layer on the substrate surface can be measured by asymmetric reflection of the XRD. For example, in case of a substrate having a c plane as a main plane (a crystal growth plane), the thickness can be measured based on an FWHM of a rocking curve of (100)ω. A thickness of the surface layer that is approximately 20 nm can be sufficiently measured by allowing an X-ray to enter (an incidence angle=89°) in approximately parallel to the substrate main plane.

It is difficult to remove the substrate surface damage layer and the surface deposit by methods other than etching. For example, crystallinity of the substrate surface damage layer cannot be restored by a heat treatment at approximately 1000° C. in an oxidizing gas (e.g., $O_2$, $N_2O$ or $H_2O$) atmosphere since the lattice vibration energy is insufficient. Moreover, the substrate surface deposit cannot be desorbed and removed in the oxidizing gas atmosphere. Therefore, removal based on etching is effective. However, the deposit can be readily removed by etching, but the damage layer cannot be sufficiently removed by etching if it is too thick. Simply prolonging an etching time results in irregularities on the substrate surface since an etching rate at defects/dislocation, latent scratches or a strain accumulated portion is high.

When growing the ZnO-based crystal layer in a thermostable state at a high temperature (600° C. or higher), irregularities produced due to excessive etching disturb a two-dimensional crystal growth process to provide the ZnO-based crystal layer having an irregular or uneven shape. Therefore, using the ZnO single crystal substrate having a thin damage layer is important.

It is good enough to carry out etching for approximately 10 minutes to 150 minutes depending on a thickness of the damage layer (an FWHM of (100)ω). Removal of the deposit may be insufficient if the etching time is less than 10 minutes, and the damage layer may be too thick and an etched surface may have irregularities if the etching time of 150 minutes or more is required.

Specifically, to remove the damage layer by etching, the FMHW of (100)ω that is less than 60 arcsec (the damage layer thickness: 1.4 μm) is preferable, or the FMHW that is less than 50 arcsec (the damage layer thickness: 0.7 μm) is more preferable. Additionally, the FWHM that is less than 40 arcsec (the damage layer thickness: 0.21 μm) is further preferable, and etching is not required if the FWHM is less than 35 arcsec.

It is to be noted that the substrate having a ZnO crystal layer once grown thereon has no damage layer and no deposit on the surface thereof, and hence it can be set in the reactor to grow the ZnO crystal layer without an etching treatment. Furthermore, when the surface of the ZnO single crystal substrate can be determined to have no damage layer from XRD analysis and the like even though the growth layer is not provided on the substrate can be used without etching.

[Crystal Growth Conditions]

Figure 30:
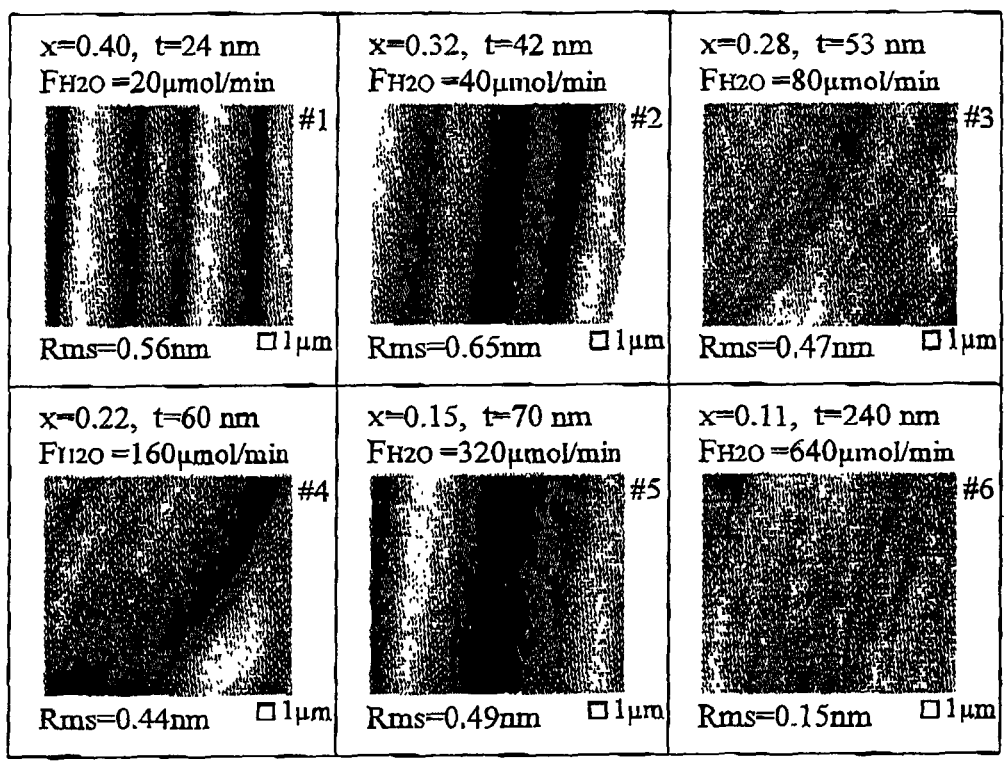
FIG. 30 is a view showing an AFM image of a Mg$_x$Zn$_{(1-x)}$O (x=0.11 to 0.40) growth layer.

Growth conditions for growing a thermostable-state ZnO-based crystal layer that is a crystal having excellent flatness and crystal orientation and a low defect/dislocation density on a ZnO single crystal substrate were examined in detail. As shown in FIG. 29, a thermostable-state ZnO-based crystal layer can be grown in an extensive growth condition range (surrounded by a double line). Further, FIG. 30 shows an AFM image of a $Mg_xZn_{(1-x)}O$ (x=0.11 to 0.40) growth layer as an example of a ZnO-based crystal. It is to be noted that a result shown in the drawing is just an example of the examination result and, giving the particulars, the thermostable-state ZnO-based crystal layer can be grown under the following conditions.

It was confirmed that a crystal layer that has a flat growth surface, an FWHM of (100)ω, which is as narrow as 35 arcsec or below and excellent crystal orientation with respect to the ZnO single crystal substrate can be obtained when a growth temperature falls within the range that is not lower than 600° C. and less than 900° C. in which 900° C. being a growth upper limit temperature. It is to be noted that a temperature that is not lower than 650° C. is preferable at which condition flatness and crystal orientation can be improved. Furthermore, a temperature that is not lower than 700° C. at which a defect/displacement density becomes very low is more preferable. In a precise sense, a temperature range that is 20° C. to 200° C. lower than the growth upper limit (i.e., a temperature range that is −20° C. to −200° C. of the growth upper limit temperature) is good.

A growth pressure can be set within an extensive pressure range from a low pressure (a reduced pressure) to an atmospheric pressure. Preferably, a growth pressure is not lower than 1 kPa. When the growth pressure is lowered, a growth rate is reduced. In particular, when the growth pressure is set to 1 kPa or below (in case of 800° C.), the growth rate is extremely reduced, and hence a pressure that is not lower than 1 kPa is preferable. Additionally, although an upper limit was set to approximately 120 kPa that is a limit of high-pressure sealing performance of the apparatus, growth was observed without problem.

With regard to the growth rate, a range of 0.1 nm/min to 70 nm/min is appropriate. For example, in case of manufacturing a semiconductor light emitting device, selecting a growth rate satisfying a purpose such as functions of a semiconductor layer (e.g., a quantum well structure layer or a current diffusion layer), impurity concentration control or residual carrier density control can suffice when growing an n-type ZnO-based semiconductor layer, a light-emission layer or a p-type ZnO-based semiconductor layer. For example, the growth rate is set to 1 nm/min to 10 nm/min for the purpose of improving crystal orientation on the initial stage of growth on the ZnO substrate, or approximately 50 nm/min during growth of the n-type ZnO-based semiconductor layer, or 0.1 nm/min to 1 nm/min for the purpose of suppressing a residual carrier density for growth of the light-emission layer.

Although a VI/II ratio (=an $F_{H_2O}/F_{DMZn}$ ratio) is a ratio of a water vapor flow rate and a DMZn flow rate, the VI/II ratio that is approximately 2 or above is appropriate, and approximately 70% or below of an amount of saturated water vapor with which aggregation of water vapor does not occur in pipes or the shower head is appropriate as an upper limit of the ratio. Practically, a value of approximately 1000 is sufficient.

With regard to a crystal composition, a $Mg_xZn_{(1-x)}O$ (0≦x≦0.68) crystal can be used as the ZnO-based crystal layer. As shown in FIG. 30, surface roughness RMS (or Rq, root mean square roughness) in 1 μm$^2$ of the AFM observation area was 0.15 to 0.65 nm, and excellent flatness was observed. It is to be noted that, when x is higher than 0.68, a part of the MgZnO crystal causes phase separation to MgO of a rock salt type crystal, and hence a value that is not greater than 0.68 is appropriate. It is to be noted that a metalorganic material such as CpMg can be used in order to grow the MgZnO crystal.

With regard to impurity doping, an organic metal such as TEGa can be added to provide an n-type, and $NH_3$ or the like can be used to provide a p-type.

[Semiconductor Device]

Figure 31:
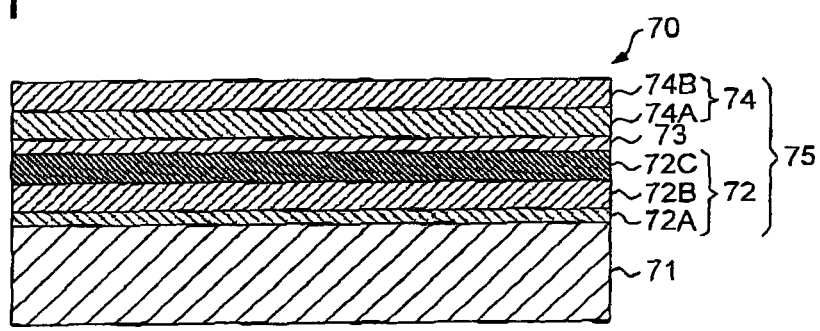
FIG. 31 is a cross-sectional view showing a layered configuration of a device-layer-formed substrate for use in manufacture of a ZnO-based semiconductor light emitting device (LED)

FIG. 31 shows a layered structure of a device-layer-formed substrate 70 that is used for manufacture of a ZnO-based semiconductor light emitting device (LED: a light emitting diode) as an example that the present invention is applied to a semiconductor device. It is to be noted that the "device layer" used herein means a layer formed of a semiconductor that should be included for serving a function of a semiconductor device. For example, in case of a simple transistor, a structural layer constituted of pn junction of an n-type semiconductor and a p-type semiconductor is included. Further, a semiconductor structural layer that is formed of an n-type semiconductor layer, a light-emission layer and a p-type semiconductor layer to perform a light emitting operation based on recombination of injected carriers is called a light emitting device layer in particular.

As shown in FIG. 31, in the LED-device-layer-formed substrate 70, a device layer 75 is formed on a ZnO single crystal substrate 71. The device layer 75 is formed of an n-type ZnO-based semiconductor layer 72, a light-emission layer 73 and a p-type ZnO-based semiconductor layer 74. More specifically, the n-type ZnO-based semiconductor layer 72 is constituted of a first n-type ZnO-based semiconductor layer 72A for improving crystallinity at the start of growth, a second n-type ZnO-based semiconductor layer 72B as a current diffusion layer, and a third n-type ZnO-based semiconductor layer 72C which serves as a hole barrier. Likewise, the p-type ZnO-based semiconductor layer 74 is formed of a first p-type ZnO-based semiconductor layer 74A which serves as an electron barrier and a second p-type ZnO-based semiconductor layer 74B which reduces a contact resistance with respect to an electrode.

The semiconductor stacked or layered structure of the device layer 75 can be formed based on the growth method according to each of the embodiments of the invention or by appropriately modifying the growth method. For example, like the growth sequence and the growth conditions in the growth method according to the third embodiment of the invention, a material gas, a dopant gas and the like can be changed to sequentially grow each semiconductor layer. Furthermore, a composition (or a band gap), a layer thickness, a conductivity type, a doping concentration (or a carrier concentration) and the like of each semiconductor layer can be appropriately modified or selected in accordance with, e.g., necessary characteristics of the semiconductor light emitting device. For example, an undoped ZnO layer can be adopted in place of the first n-type ZnO-based semiconductor layer 72A. Further, it is possible to form, for example, a Ga doped ZnO layer as the second n-type ZnO-based semiconductor layer 72B, a Ga doped $Mg_xZn_{1-x}O$ layer as the third n-type ZnO-based semiconductor layer 72C, a quantum well (QW) light-emission layer including a ZnO layer and a $Mg_xZn_{1-x}O$ layer as the light-emission layer 73, a nitrogen (N) doped $Mg_xZn_{1-x}O$ layer as the first p-type ZnO-based semiconductor layer 74A, and a nitrogen (N) doped ZnO layer as the second p-type ZnO-based semiconductor layer 74B.

It is to be noted that, when forming, e.g., the n-type ZnO-based semiconductor layer 72 by the method according to the present invention, one or more impurities selected from Al (aluminum), Ga (gallium) and In (indium) are added as n-type impurities. According to the present invention, the added impurities do not diffuse into other layers, since a defect/dislocation density in the ZnO-based semiconductor layer is very low. Therefore, the added impurities are not compensated, thereby increasing an activation ratio of the carriers. Accordingly, the impurities do not have to be added more than necessity, and hence crystallinity of the n-type ZnO-based semiconductor layer is not decreased.

Further, since an alkali metal such as Li, Na or K contained in the substrate (in case of a substrate obtained by the hydrothermal method) does not diffuse into the ZnO-based semiconductor growth layer, performance of the layered ZnO-based semiconductor layer are not degraded.

The diffused impurities that diffuse into the growth layer from the substrate is preferably not greater than $1\times10^{16}$ (atoms·$cm^{-3}$) or below, more preferably not greater than $5\times10^{15}$ (atoms·$cm^{-3}$), further more preferably not greater than $1\times10^{15}$ (atoms·$cm^{-3}$), when considering control of conductivity of the n-type ZnO-based semiconductor layer and the p-type ZnO-type semiconductor layer or a carrier recombination efficiency of the light-emission layer. More specifically, it is preferable to achieve the following relationship.

(n-Type Layer)

In case of the n-type ZnO-based semiconductor layer, since an n-type impurity is added in the range of $1\times10^{17}$ to $5\times10^{19}$ (atoms·$cm^{-3}$) to provide the n-type layer, no problem occurs when a diffused impurity concentration is $\frac{1}{10}$ to $\frac{1}{100}$ of an added impurity concentration. Although not preferable, if the diffused impurity is an n-type impurity (e.g., Al, Ga or In), the concentration that is not lower than $\frac{1}{10}$ does not cause a problem. Considering such a situation, a value that is not greater than $1\times10^{16}$ (atoms·$cm^{-3}$) is preferable in a practical point of view.

(p-Type Layer)

In case of the p-type ZnO-based semiconductor layer, since a p-type impurity is added in the range of $1\times10^{18}$ to $5\times10^{20}$ (atoms·$cm^{-3}$) to provide the p-type layer, no problem occurs when a diffused impurity concentration is $\frac{1}{100}$ to $\frac{1}{1000}$ of an added impurity concentration. It is to be noted that, in the ZnO-based semiconductor, the added impurity concentration is higher since an activation rate of the p-type added impurity is low. Furthermore, the concentration of the impurities Li, K and Na is desirably very low, since the impurities compensate generated holes. Considering such a situation, the diffused impurity concentration is preferably not greater than $1\times10^{15}$ (atoms·$cm^{-3}$) in a practical point of view.

(Light-Emission Layer)

In case of the light-emission layer, a value that is not greater than $1\times10^{15}$ (atoms·$cm^{-3}$) is preferable as a concentration of Li, K or Na that serves as a nonradiative center (i.e., nonradiative transition) and reduces a light-emission efficiency. Additionally, since even an impurity that serves as a radiative center (i.e., radiative transition) causes a problem of an emission spectrum broadening, e.g., transition between a donor and a band, transition between an acceptor and a band or transition between a donor and an acceptor, a value that is not greater than $5\times10^{15}$ (atoms·$cm^{-3}$) is preferable as an unintended diffused impurity concentration.

Further, in case of a quantum well (QW) active layer, an effect of using the ZnO-based semiconductor layer having excellent flatness and single crystallinity is further prominent, since a fluctuation of a layer thickness of a crystal layer (a well layer, a barrier layer) changes, e.g., quantum level energy or a quantum level density to greatly affect an emission wavelength or an internal quantum efficiency.

A semiconductor light emitting device (LED) can be formed by forming an n-side electrode and a p-side electrode on the LED-device-layer-formed substrate 70 and dividing into pieces by scribing and breaking.

The semiconductor layer according to the present invention is excellent in flatness. Accordingly, a high accuracy can be obtained in a semiconductor process, and a fabrication yield in, e.g., cleavage or breaking yield is high.

Figure 32A:
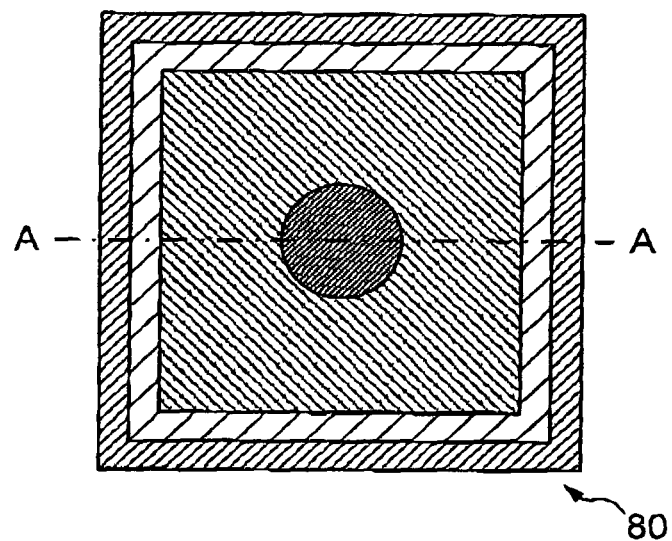
FIGS. 32A and 32B are a top view and a cross-sectional view of a semiconductor light emitting device (LED)
Figure 32B:
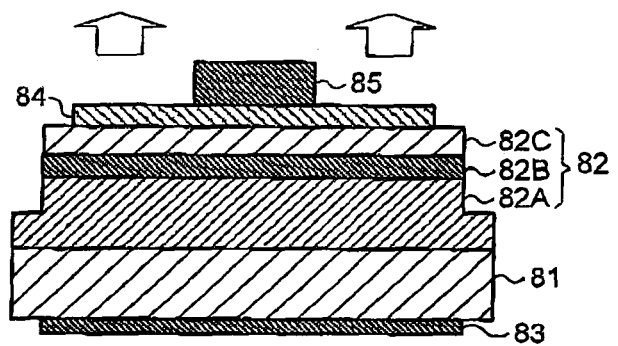

Additionally, FIGS. 32A and 32B show a configuration of a ZnO-based semiconductor light emitting device (LED) 80 as an application example of the present invention. FIG. 32A is a top view of the semiconductor light emitting device 80, and FIG. 32B is a cross-sectional view taken along a line A-A in FIG. 32A.

The ZnO-based semiconductor light emitting device 80 includes an n-type ZnO-based semiconductor layer 82A, a light-emission layer 82B and a p-type ZnO-based semiconductor layer 82C configuring a device layer on a ZnO substrate 81. Further, Ti/Au is formed as an n-side connection electrode 83 on the ZnO substrate 81, and Ni—O/Au as a p-side transparent electrode 84 is formed on the p-type ZnO-based semiconductor layer 82C and Ni/Pt/Au as a p-side connection electrode 85 is formed on the p-side transparent electrode 84. It is to be noted that the representation "X/Y" means a configuration that X is formed on the ZnO-based semiconductor layer side and Y is laminated thereon.

Since junction properties of the MgZnO-based semiconductor layer with an oxide transparent conductive film are excellent, ITO or the like can be used for the n-side connection electrode 83, $CuAlO_2$ or the like can be used for the p-side transparent electrode 84, and $Ni_2O$ or the like can be used for the p-side connection electrode 85. Adopting such a configuration enables forming a transparent semiconductor light emitting device. It is to be noted that arrows denote light projecting directions in the drawing.

Figure 33:
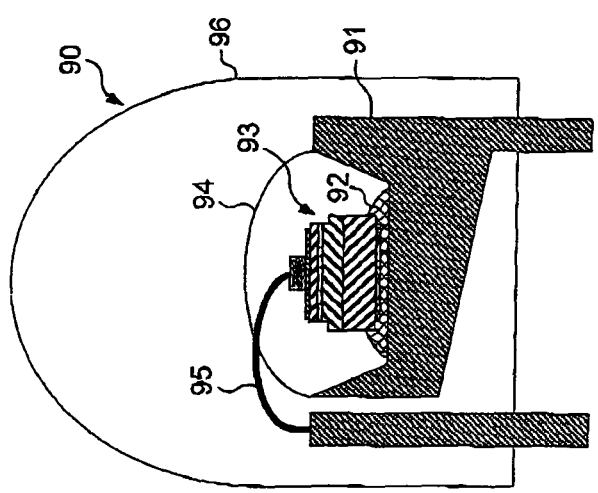
FIG. 33 is a view schematically showing a configuration of an LED lamp using a ZnO-based semiconductor light emitting device.

Additionally, FIG. 33 shows a configuration of an LED lamp 90 using a ZnO-based semiconductor light emitting device as an application example of the present invention. A ZnO-based semiconductor light emitting device 93 has the same configuration as, e.g., the ZnO-based semiconductor device 80. The ZnO-based semiconductor light emitting device 93 is secured and electrically connected to an upper side of a frame 91 through a silver paste 92. Further, the ZnO-based semiconductor light emitting device 93 is encapsulated in a fluorescent layer 94. An upper electrode of the ZnO-based semiconductor light emitting device 93 is connected to an electrode terminal 97 through a gold wire 95. These constituent elements are hermetically sealed by a resin mold 96, thereby configuring the LED lamp 90.

A refractive index of the ZnO-based semiconductor light emitting device 93 is $n_{LED}$=2.0, a refractive index of a resin of the resin mold 96 is $n_{MOLD}$=1.5 and a refractive index of air is $n_{AIR}$=1.0, thus the refractive index difference between the ZnO-based semiconductor light emitting device 93 and the resin mold 96 is 0.5, and the refractive index difference between the resin mold 96 and air is 0.5. Therefore, a light extraction efficiency from the ZnO-based semiconductor light emitting device 93 is very high, whereby ultraviolet to chromatic LEDs having a high light-emission output can be manufactured.

In the foregoing embodiments, $Mg_xZn_{(1-x)}O$ is taken as an example of the ZnO-based crystal, but any other ZnO-based compound crystal may be used. For example, a ZnO-based compound crystal in which a part of Zn (zinc) is substituted by calcium (Ca) may be used. Alternatively, a ZnO-based compound crystal in which a part of O (oxygen) is substituted by selenium (Se), sulfur (S) or tellurium (Te) may be used.

Further, although the semiconductor light emitting device (LED) has been described as an example in the foregoing embodiments, the present invention is not restricted thereto, and it can be applied to general semiconductor devices or electronic devices. For example, it can be applied to various devices, e.g., a surface acoustic wave device, an electronic device such as an MOSFET, a semiconductor laser (LD: Laser diode), or an optical semiconductor device such as a semiconductor light receiving device.

As described above in detail, according to the present invention, the ZnO-based single crystal layer that is superior in flatness and crystal orientation and has a low defect and dislocation density and high integrity can be grown. More specifically, the present invention has excellent advantages, e.g., accumulation of the substrate impurities, diffusion of the impurities into the ZnO-based crystal layer and diffusion of impurities between grown crystal layers can be suppressed and an increase or growth of defects and dislocation can be suppressed.

Therefore, in application to a semiconductor device and the like, excellent impurity concentration control, impurity concentration profile control and abrupt interface control can be performed, and a high-quality crystal multi-layered configuration can be provided, whereby a semiconductor device having excellent characteristics can be provided. Moreover, a ZnO-based crystal semiconductor light emitting device having excellent electrical characteristics and light emitting efficiency can be manufactured.

In particular, the most difficult problem when providing the ZnO-based semiconductor device, i.e., p-type conductivity control can be overcome. That is, a problem that a carrier of a positive charge (i.e., holes) produced due to a p-type impurity is compensated by defects or dislocation can be solved, thereby obtaining a p-type crystal having excellent conductivity.

Therefore, according to the present invention, the ZnO-based crystal that has excellent flatness and crystal orientation and a low defect and dislocation density can be grown, and a semiconductor device such as a high-performance high-yield semiconductor light emitting device having excellent electrical characteristics, optical characteristics and the like can be manufactured.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2009-125494 which is hereby incorporated by reference.

What is claimed is;:

1. A semiconductor device manufactured by forming ZnO-based semiconductor layers on a substrate of a ZnO single crystal by an MOCVD method, comprising:
   a ZnO-based single crystal layer grown directly on said substrate at a growth temperature that is equal to or greater than 600° C. and less than 900° C. using a polar oxygen material and a metalorganic compound containing no oxygen; and
   a device layer grown on said ZnO-based single crystal layer, said device layer including at least one of an n-type ZnO-based semiconductor layer and a p-type ZnO-based semiconductor layer;
   wherein a concentration of a substrate-derived impurity in said ZnO-based single crystal layer does not exceed a concentration of the impurity contained in said substrate.

2. The semiconductor device according to claim 1, wherein the concentration of said substrate-derived impurity is less than or equal to $1 \times 10^{15}$ cm$^{-3}$, when said substrate-derived impurity is aluminum (Al).

3. The semiconductor device according to claim 1, wherein the concentration of said substrate-derived impurity is less than or equal to $1 \times 10^{14}$ cm$^{-3}$, when said substrate-derived impurity is lithium (Li).

4. The semiconductor device according to claim 1, wherein said substrate is a c-plane ZnO single crystal substrate.

5. The semiconductor device according to claim 1, wherein a full width at half maximum (FWHM) of XRD(100)ω rocking curve of said ZnO-based single crystal layer is equal to 40 arcsec or less.

6. The semiconductor device according to claim 1, wherein said ZnO-based single crystal layer is a $Mg_xZn_{(1-x)}O$ ($x \leq 0.68$) layer.

7. The semiconductor device according to claim 1, wherein said device layer includes the p-type ZnO-based single crystal layer.

8. The semiconductor device according to claim 1, wherein:
   said semiconductor device is an LED (light emitting diode); and
   said device layer includes the n-type ZnO-based single crystal layer, a light-emission layer and the p-type ZnO-based single crystal layer.

9. A ZnO-based single-crystal-layer-formed substrate, comprising:
   a ZnO-based single crystal substrate containing at least one of Al, Li and Si as an impurity at a predetermined concentration; and
   a ZnO-based single crystal layer grown directly on said ZnO-based single crystal substrate,
   wherein accumulation of the impurity is not observed in an interface between said ZnO-based single crystal substrate and said ZnO-based single crystal layer when measurement is performed based on SIMS (secondary ion mass spectroscopy), and
   a concentration of the impurity in the ZnO-based single crystal layer is lower than the predetermined concentration when measurement is performed based on the SIMS.

* * * * *